United States Patent
Suzawa et al.

(10) Patent No.: US 9,023,684 B2
(45) Date of Patent: May 5, 2015

(54) SEMICONDUCTOR DEVICE AND MANUFACTURING METHOD THEREOF

(75) Inventors: Hideomi Suzawa, Atsugi (JP); Shinya Sasagawa, Chigasaki (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 547 days.

(21) Appl. No.: 13/404,652

(22) Filed: Feb. 24, 2012

(65) Prior Publication Data

US 2012/0225520 A1  Sep. 6, 2012

(30) Foreign Application Priority Data

Mar. 4, 2011  (JP) ................. 2011-048134

(51) Int. Cl.
H01L 21/336 (2006.01)
H01L 29/49 (2006.01)
H01L 29/786 (2006.01)
H01L 29/66 (2006.01)

(52) U.S. Cl.
CPC ...... *H01L 29/4908* (2013.01); *H01L 29/78621* (2013.01); *H01L 29/7869* (2013.01); *H01L 29/66969* (2013.01)

(58) Field of Classification Search
None
See application file for complete search history.

(56) References Cited

U.S. PATENT DOCUMENTS

| | | |
|---|---|---|
| 5,528,032 A | 6/1996 | Uchiyama |
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Seahvosh Nikmanesh
(74) *Attorney, Agent, or Firm* — Eric J. Robinson; Robinson Intellectual Property Law Office, P.C.

(57) ABSTRACT

An object is to provide a transistor including an oxide semiconductor having favorable electrical characteristics and a manufacturing method thereof. A semiconductor device includes an oxide semiconductor film and an insulating film over a substrate. An end portion of the oxide semiconductor film is in contact with the insulating film. The oxide semiconductor film includes a channel formation region and regions containing a dopant between which the channel formation region is sandwiched. The semiconductor device further includes a gate insulating film over and in contact with the oxide semiconductor film, a gate electrode with a sidewall insulating film over the gate insulating film, and a source electrode and a drain electrode in contact with the sidewall insulating film, the oxide semiconductor film, and the insulating film.

15 Claims, 16 Drawing Sheets

(56) References Cited

U.S. PATENT DOCUMENTS

| | | |
|---|---|---|
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,821,002 B2 | 10/2010 | Yamazaki et al. |
| 7,910,490 B2 | 3/2011 | Akimoto et al. |
| 7,932,521 B2 | 4/2011 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0136743 A1 | 6/2010 | Akimoto et al. |
| 2010/0159639 A1 | 6/2010 | Sakata |
| 2011/0024740 A1 | 2/2011 | Yamazaki et al. |
| 2011/0024750 A1 | 2/2011 | Yamazaki et al. |
| 2011/0024751 A1 | 2/2011 | Yamazaki et al. |
| 2011/0027980 A1 | 2/2011 | Yamazaki et al. |
| 2011/0031491 A1 | 2/2011 | Yamazaki et al. |
| 2011/0037068 A1 | 2/2011 | Yamazaki et al. |
| 2011/0104851 A1 | 5/2011 | Akimoto et al. |
| 2011/0117697 A1 | 5/2011 | Akimoto et al. |
| 2011/0121290 A1 | 5/2011 | Akimoto et al. |
| 2011/0163311 A1 | 7/2011 | Akimoto et al. |
| 2012/0225520 A1* | 9/2012 | Suzawa et al. .................. 438/104 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 | 4/2007 |
| JP | 2007-123861 | 5/2007 |
| JP | 2008-103666 | 5/2008 |
| JP | 2009-224479 | 10/2009 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar

(56) References Cited

OTHER PUBLICATIONS

Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MoO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

(56) References Cited

OTHER PUBLICATIONS

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel, YbFe2O4, and Yb2Fe3O7 Types of Structures for Compounds in the In2O3 and Sc2O3-A2O3-BO Systems [A; Fe, Ga, or Al; B: Mg, Mn, Fe, Ni, Cu, or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner 132  130

132a  132b 130a  130b 134  136

SEMICONDUCTOR DEVICE AND MANUFACTURING METHOD THEREOF

BACKGROUND OF THE INVENTION

1. Field of the Invention

The present invention relates to a semiconductor device which includes a circuit including a semiconductor element such as a transistor, and a method for manufacturing the semiconductor device. For example, the present invention relates to a power device incorporated in a power circuit; a semiconductor integrated circuit including a memory, a thyristor, a converter, an image sensor, or the like; an electro-optical device typified by a liquid crystal display panel; a light-emitting display device including a light-emitting element; and an electronic device including any of the above as a component.

Note that in this specification, a semiconductor device means any device that can function by utilizing semiconductor characteristics. An electro-optical device, a light-emitting display device, a semiconductor circuit, and an electronic device are all semiconductor devices.

2. Description of the Related Art

A transistor formed over a glass substrate or the like is manufactured using amorphous silicon, polycrystalline silicon, or the like, as typically seen in a liquid crystal display device. Although a transistor including amorphous silicon has low field-effect mobility, it can be formed over a larger glass substrate. On the other hand, although a transistor including polycrystalline silicon has high field-effect mobility, it is not suitable for being formed over a larger glass substrate.

In view of the foregoing, attention has been drawn to a technique by which a transistor is manufactured using an oxide semiconductor, and such a transistor is applied to an electronic device or an optical device. For example, Patent Document 1 and Patent Document 2 disclose a technique in which a transistor is manufactured using zinc oxide or an In—Ga—Zn—O-based oxide as an oxide semiconductor and such a transistor is used as a switching element or the like of a pixel of a display device.

Meanwhile, it has been pointed out that hydrogen is a source of carriers particularly in an oxide semiconductor. Therefore, some measures need to be taken to prevent hydrogen from entering the oxide semiconductor at the time of forming the oxide semiconductor. Further, shift of the threshold voltage of a transistor including an oxide semiconductor is reduced by reducing the amount of hydrogen contained in not only the oxide semiconductor but also a gate insulating film in contact with the oxide semiconductor (see Patent Document 3).

REFERENCES

[Patent Document 1] Japanese Published Patent Application No. 2007-123861

[Patent Document 2] Japanese Published Patent Application No. 2007-96055

[Patent Document 3] Japanese Published Patent Application No. 2009-224479

SUMMARY OF THE INVENTION

Moreover, as a carrier source other than hydrogen contained in an oxide semiconductor, oxygen vacancies (also referred to as oxygen defects) in the oxide semiconductor can be given. Some of the oxygen vacancies serve as donors and generate electrons that are carriers in the oxide semiconductor. The presence of oxygen vacancies in a channel formation region of a transistor causes electrons to be generated in the channel formation region and is thus a factor causing a negative shift of the threshold voltage of the transistor.

When side surfaces of an oxide semiconductor film are processed into a desired shape in order to manufacture a semiconductor device in which the oxide semiconductor film is used, the side surfaces of the oxide semiconductor film are exposed to a reduced-pressure atmosphere or a reducing atmosphere in a reaction chamber while they are in an active state. Therefore, oxygen is extracted from the side surfaces of the oxide semiconductor film to the reaction chamber and oxygen vacancies are created. Some of the oxygen vacancies serve as donors and generate electrons which are carriers, so that the side surfaces of the oxide semiconductor film have n-type conductivity. A source electrode and a drain electrode of the transistor are in contact with the side surfaces of the oxide semiconductor film having n-type conductivity, so that leakage current is generated between the source electrode and the drain electrode through the side surfaces of the oxide semiconductor film. The leakage current increases the off-state current of the transistor. Further, there is a possibility that current flowing through the side surface of the oxide semiconductor film causes formation of a transistor in which the side surface of the oxide semiconductor film serves as a channel formation region.

Thus, it is an object of one embodiment of the present invention to solve at least one of the above problems. In other words, it is an object to provide a semiconductor device having electrical characteristics which are favorable and less likely to fluctuate.

According to one embodiment of the present invention, in a manufacturing process of a semiconductor device including an oxide semiconductor film, an insulating film containing oxygen is provided in contact with the oxide semiconductor film in order to prevent release of oxygen from the oxide semiconductor film. Hereinafter, specific description is given.

One embodiment of the present invention is a method for manufacturing a semiconductor device, which includes the steps of: sequentially forming a first insulating film, an oxide semiconductor film, and a second insulating film over a substrate; forming an element isolation groove in the first insulating film by etching an element isolation region of the second insulating film, the oxide semiconductor film, and the first insulating film; forming a third insulating film over the second insulating film and the element isolation groove; exposing the second insulating film and embedding the third insulating film in the element isolation groove by subjecting the third insulating film to a planarization treatment; exposing the oxide semiconductor film by etching the second insulating film; forming a gate insulating film over the third insulating film and the exposed oxide semiconductor film; forming a gate electrode over the gate insulating film; forming a first region containing a dopant at a first concentration in the oxide semiconductor film by adding the dopant to the oxide semiconductor film using the gate electrode as a mask; forming a sidewall insulating film on a side surface of the gate electrode; forming a second region containing the dopant at a second concentration in the oxide semiconductor film by adding the dopant to the oxide semiconductor film using the gate electrode and the sidewall insulating film as a mask; and forming a source electrode and a drain electrode in contact with the third insulating film and the second region containing the dopant.

In the above embodiment, it is preferable that the first concentration of the dopant in the first region containing the dopant be lower than the second concentration of the dopant in the second region containing the dopant.

In the above embodiment, it is preferable that the source electrode or the drain electrode include a first conductive film and a second conductive film and the first conductive film be in contact with the sidewall insulating film. Further, it is preferable that the first conductive film be thinner than the second conductive film.

In the above embodiment, it is preferable that an insulating material from which oxygen is released by application of heat be used for the insulating film. An insulating film which contains oxygen at a proportion exceeding the stoichiometric proportion is preferably used as the insulating film from which oxygen is released by application of heat. When the insulating film is provided in contact with the oxide semiconductor film or when the insulating film is provided in the vicinity of the oxide semiconductor film, oxygen can be released from the insulating film and diffused into (or supplied to) the oxide semiconductor film in heat treatment. Thus, oxygen vacancies in the oxide semiconductor film can be reduced.

Examples of the insulating film from which oxygen is released by application of heat include films of silicon oxide, silicon oxynitride, silicon nitride oxide, aluminum oxynitride, gallium oxide, hafnium oxide, yttrium oxide, and the like.

In the above embodiment, it is preferable that an aluminum oxide film be used as the third insulating film. With the use of an aluminum oxide film as the third insulating film in contact with a side surface of the oxide semiconductor film, oxygen can be prevented from being released from the side surface of the oxide semiconductor film. Thus, oxygen vacancies can be prevented from being created at the side surface of the oxide semiconductor film.

In the above embodiment, it is preferable that a metal oxide containing at least one element selected from In, Ga, Sn, and Zn be used for the oxide semiconductor film.

The oxide semiconductor film is in a single crystal state, a polycrystalline (also referred to as polycrystal) state, an amorphous state, or the like.

The oxide semiconductor film is preferably a CAAC-OS (c-axis aligned crystalline oxide semiconductor) film.

The CAAC-OS film is not completely single crystal nor completely amorphous. The CAAC-OS film is an oxide semiconductor film with a crystal-amorphous mixed phase structure where crystal parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

With use of the CAAC-OS film in a transistor, change in electrical characteristics of the transistor due to irradiation with visible light or ultraviolet light can be reduced. Thus, the transistor has high reliability.

Note that part of oxygen included in the oxide semiconductor film may be substituted with nitrogen.

According to one embodiment of the present invention, it is possible to provide a semiconductor device including an oxide semiconductor having electrical characteristics which are favorable and less likely to fluctuate.

DETAILED DESCRIPTION OF THE INVENTION

Figure 1A:
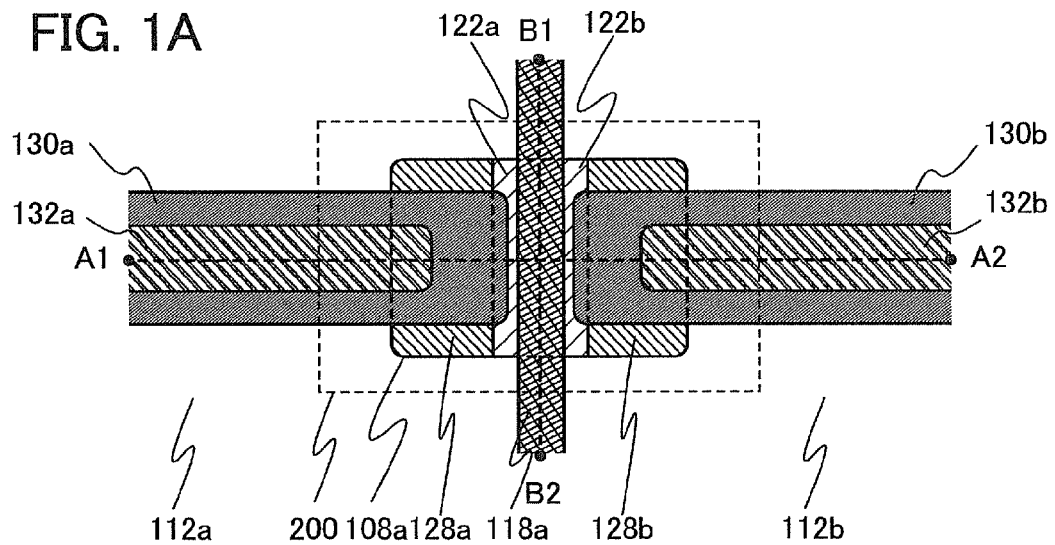
FIGS. 1A to 1C are a top view and cross-sectional views illustrating a semiconductor device according to an embodiment of the present invention.

Embodiments of the present invention will be described in detail with reference to the drawings. Note that the present invention is not limited to the following description, and it will be easily understood by those skilled in the art that various changes and modifications can be made without departing from the spirit and scope of the present invention. Therefore, the present invention should not be construed as being limited to the description in the following embodiments. Note that in the structures of the present invention described below, the same portions or portions having similar functions are denoted by the same reference numerals in different drawings, and description of such portions is not repeated.

Note that in each drawing described in this specification, the size, the film thickness, or the region of each component may be exaggerated for clarity. Therefore, embodiments of the present invention are not limited to such scales.

Furthermore, terms such as "first", "second", and "third" in this specification are used in order to avoid confusion among components, and the terms do not limit the components numerically. Therefore, for example, the term "first" can be replaced with the term "second", "third", or the like as appropriate.

Embodiment 1

In this embodiment, a structure and a manufacturing method of a semiconductor device according to one embodiment of the present invention will be described with reference to FIGS. 1A to 1C, FIGS. 2A to 2D, FIGS. 3A to 3D, FIGS. 4A to 4D, and FIGS. 5A to 5D.

<Structure of Semiconductor Device>

Figure 1B:
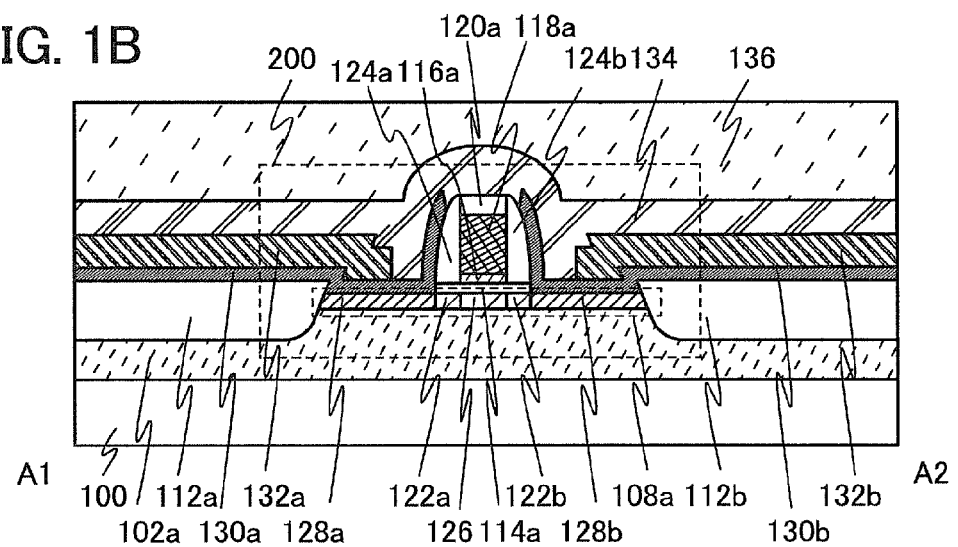
Figure 1C:
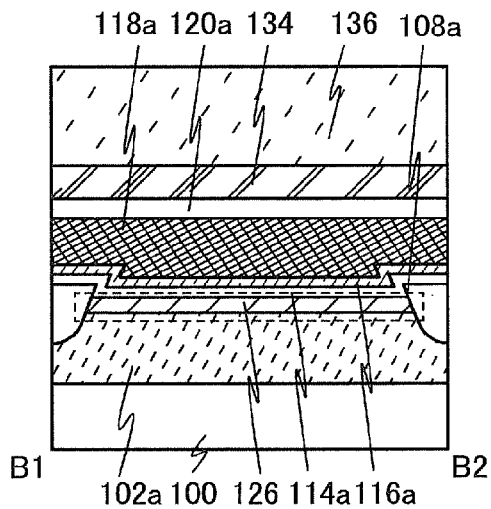

FIGS. 1A to 1C are a top view and cross-sectional views of a transistor 200. FIG. 1A is a top view of the transistor 200. FIG. 1B is a cross-sectional view taken along dashed line A1-A2 in FIG. 1A. FIG. 1C is a cross-sectional view taken along dashed line B1-B2 in FIG. 1A. Note that in FIG. 1A, some of components of the transistor 200 (e.g., a gate insulating film 114a, an insulating film 120a, sidewall insulating films 124a and 124b, an insulating film 134, an insulating film 136, and the like) are omitted for simplicity.

The transistor 200 illustrated in FIGS. 1A to 1C includes an insulating film 102a over a substrate 100, an oxide semiconductor film 108a over the insulating film 102a, the gate insulating film 114a in contact with the oxide semiconductor film 108a, a gate electrode over the gate insulating film 114a, the sidewall insulating films 124a and 124b on side surfaces of the gate electrode, and a source electrode and a drain electrode in contact with the sidewall insulating films 124a and 124b and the oxide semiconductor film 108a. In addition, the insulating film 134 and the insulating film 136 are provided so as to cover the transistor 200.

The gate electrode has a two-layer structure of a conductive film 116a and a conductive film 118a. The source electrode has a two-layer structure of a conductive film 130a and a conductive film 132a, and the drain electrode has a two-layer structure of a conductive film 130b and a conductive film 132b. The conductive films 130a and 130b are preferably thinner than the conductive films 132a and 132b. Note that the conductive films 130a and 130b may serve as the source electrode and the drain electrode, and the conductive films 132a and 132b may serve as lead wirings.

In the transistor 200, the insulating film 120a is provided over the gate electrode. With the insulating film 120a provided over the gate electrode, a short circuit between the gate electrode and the source and drain electrodes can be prevented.

In the transistor 200 illustrated in FIGS. 1A to 1C, the insulating film 102a, insulating films 112a and 112b, and the gate insulating film 114a are formed in contact with the oxide semiconductor film 108a. Here, insulating films from which oxygen is released by application of treatment are preferably used as the insulating films in contact with the oxide semiconductor film 108a.

Here, the expression "oxygen is released by application of heat" means that the amount of released oxygen which is converted into oxygen atoms is greater than or equal to $1.0 \times 10^{18}$ atoms/cm$^3$, preferably greater than or equal to $3.0 \times 10^{20}$ atoms/cm$^3$ in thermal desorption spectroscopy (TDS).

Here, a method for measuring the amount of released oxygen which is converted into oxygen atoms using TDS analysis will be described below.

The amount of released gas in TDS analysis is proportional to the integral value of ion intensity. Therefore, the amount of released gas can be calculated from the ratio between the integral value of a measured ion intensity and the reference value of a standard sample. The reference value of a standard sample refers to the ratio of the predetermined density of atoms contained in the sample to the integral value of an ion intensity corresponding to the atoms.

For example, the number of released oxygen molecules ($N_{O2}$) from an insulating film can be found according to Equation 1 with the TDS analysis results of a silicon wafer containing hydrogen at a predetermined density which is the standard sample and the TDS analysis results of the insulating film. Here, all gases having a mass number of 32 which are obtained by the TDS analysis are assumed to originate from an oxygen molecule. CH$_3$OH, which is given as a gas having a mass number of 32, is not taken into consideration on the assumption that it is unlikely to be present. Further, an oxygen molecule including an oxygen atom having a mass number of 17 or 18 which is an isotope of oxygen is also not taken into consideration because the proportion of such a molecule in the natural world is minimal.

$$N_{O2} = N_{H2}/S_{H2} \times S_{O2} \times \alpha \quad \text{(Equation 1)}$$

$N_{H2}$ is the value obtained by conversion of the number of hydrogen molecules released from the standard sample into density. $S_{H2}$ is the integral value of an ion intensity when the standard sample is subjected to TDS analysis. Here, the reference value of the standard sample is set to $N_{H2}/S_{H2}$. $S_{O2}$ is the integral value of an ion intensity when the insulating film is subjected to TDS analysis. α is a coefficient which influences ion intensity in TDS analysis. Refer to Japanese Published Patent Application No. H6-275697 for details of Equation 1. Note that the amount of released oxygen from the above insulating film was measured with a thermal desorption spectroscopy apparatus produced by ESCO Ltd., EMD-WA1000S/W using a silicon wafer containing hydrogen atoms at $1\times10^{16}$ atoms/cm$^3$ as the standard sample.

Further, in the TDS analysis, oxygen is partly detected as oxygen atoms. The ratio between oxygen molecules and oxygen atoms can be calculated from the ionization rate of the oxygen molecules. Note that, since the above α includes the ionization rate of oxygen molecules, the number of the released oxygen atoms can also be estimated through the evaluation of the number of the released oxygen molecules.

Note that $N_{O2}$ is the number of released oxygen molecules. For the insulating film, the amount of released oxygen when converted into oxygen atoms is twice the number of the released oxygen molecules.

In the above structure, the insulating film from which oxygen is released by application of heat may be oxygen-excess silicon oxide ($SiO_x$ (x>2)). In the oxygen-excess silicon oxide ($SiO_x$ (x>2)), the number of oxygen atoms per unit volume is more than twice the number of silicon atoms per unit volume. The number of silicon atoms and the number of oxygen atoms per unit volume are measured by Rutherford backscattering spectrometry.

When the insulating film from which oxygen is released by application of heat is provided in contact with the oxide semiconductor film 108a or when the insulating film from which oxygen is released by application of heat is provided in the vicinity of the oxide semiconductor film 108a, oxygen can be released from the insulating film and diffused into (or supplied to) the oxide semiconductor film 108a in heat treatment. Thus, oxygen vacancies in the oxide semiconductor film 108a can be reduced.

The insulating film from which oxygen is released by heat application can be one or more films of silicon oxide, silicon oxynitride, silicon nitride oxide, aluminum oxynitride, gallium oxide, hafnium oxide, yttrium oxide, and the like.

Here, insulating films capable of preventing oxygen from being released from side surfaces of the oxide semiconductor film 108a may be provided as the insulating films 112a and 112b in contact with the side surfaces of the oxide semiconductor film 108a. For example, aluminum oxide films can be used as the insulating films capable of preventing oxygen from being released from the side surfaces of the oxide semiconductor film 108a. With aluminum oxide films provided in contact with the side surfaces of the oxide semiconductor film 108a, oxygen can be prevented from being released from the side surfaces of the oxide semiconductor film 108a. Furthermore, aluminum oxide films have high resistance to dry etching. Therefore, when provided in contact with the side surfaces of the oxide semiconductor film 108a, the aluminum oxide films can prevent the side surfaces of the oxide semiconductor film 108a from being exposed during a transistor manufacturing process. Aluminum oxide films provided as the insulating films 112a and 112b can prevent oxygen release from the side surfaces of the oxide semiconductor film 108a and exposure of the side surfaces of the oxide semiconductor film 108a, and therefore can prevent creation of oxygen vacancies at the side surfaces of the oxide semiconductor film 108a.

A metal oxide containing at least one element selected from In, Ga, Sn, and Zn is used for the oxide semiconductor film 108a. Typically, a four-component metal oxide such as an In—Sn—Ga—Zn—O-based metal oxide; a three-component metal oxide such as an In—Ga—Zn—O-based metal oxide, an In—Sn—Zn—O-based metal oxide, an In—Al—Zn—O-based metal oxide, a Sn—Ga—Zn—O-based metal oxide, an Al—Ga—Zn—O-based metal oxide, or a Sn—Al—Zn—O-based metal oxide; a two-component metal oxide such as an In—Zn—O-based metal oxide or a Sn—Zn—O-based metal oxide; a one-component metal oxide such as ZnO, SnO, or InO; or the like can be used. Moreover, silicon oxide may be contained in the above described metal oxides.

Here, for example, an In—Ga—Zn—O-based material means an oxide containing indium (In), gallium (Ga), and zinc (Zn), and there is no particular limitation on the composition ratio. An element other than indium, gallium, and zinc may also be contained. At this time, the amount of oxygen is preferably in excess of stoichiometric proportion in the oxide semiconductor film. When the amount of oxygen is in excess of stoichiometric proportion, generation of carriers which results from oxygen vacancies in the oxide semiconductor film can be suppressed.

Note that a metal oxide which is used as the oxide semiconductor film 108a has an energy gap of 2 eV or more, preferably 2.5 eV or more, further preferably 3 eV or more. In this manner, the off-state current of the transistor can be reduced by using a metal oxide having a wide energy gap for the oxide semiconductor film 108a.

The oxide semiconductor film 108a is preferably formed using a non-single-crystal material including a phase which has triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction, that is, a c-axis-aligned crystalline material. Alternatively, the oxide semiconductor film 108a may have an amorphous structure.

The oxide semiconductor film 108a may contain nitrogen at a concentration of lower than or equal to $5\times10^{18}$ atoms/cm$^3$.

The concentration of an alkali metal or an alkaline earth metal in the oxide semiconductor film 108a is preferably lower than or equal to $1\times10^{18}$ atoms/cm$^3$, more preferably lower than or equal to $2\times10^{16}$ atoms/cm$^3$. When an alkali metal or an alkaline earth metal is bonded to an oxide semiconductor, carriers are generated in some cases, which causes an increase in the off-state current of the transistor.

The oxide semiconductor film 108a includes a channel formation region 126, regions 122a and 122b containing a dopant between which the channel formation region 126 is sandwiched, and regions 128a and 128b containing the dopant between which the regions 122a and 122b containing the dopant are sandwiched.

The concentration of hydrogen in the channel formation region 126 of the oxide semiconductor film 108a is preferably lower than $5\times10^{18}$ atoms/cm$^3$, more preferably lower than or equal to $1\times10^{18}$ atoms/cm$^3$, still more preferably lower than or equal to $5\times10^{17}$ atoms/cm$^3$, further more preferably lower than or equal to $1\times10^{16}$ atoms/cm$^3$. This is because if the concentration of hydrogen is high, by a bond of hydrogen and an element contained in an oxide semiconductor, part of hydrogen serves as a donor and generates electrons as carriers.

By decreasing the concentration of hydrogen in the channel formation region 126 of the oxide semiconductor film 108a, an i-type (intrinsic) semiconductor or a semiconductor extremely close to an i-type semiconductor can be obtained. Thus, the off-state current of the transistor can be extremely small. For example, the off-state current at room temperature (25° C.) can be smaller than or equal to 10 zA (1 zA (zeptoampere) is $1 \times 10^{-21}$ A).

The regions 122a and 122b containing the dopant and the regions 128a and 128b containing the dopant in the oxide semiconductor film 108a contain, as the dopant, at least one of hydrogen, helium, neon, argon, krypton, and xenon.

Further, the regions 122a and 122b containing the dopant and the regions 128a and 128b containing the dopant in the oxide semiconductor film 108a have a high carrier density or a large number of defects because of the dopant. Therefore, the conductivity of the regions 122a and 122b containing the dopant and the regions 128a and 128b containing the dopant can be higher than that of an oxide semiconductor region which does not contain a dopant (i.e., the channel formation region 126).

In this embodiment, the regions 122a and 122b containing the dopant in the oxide semiconductor film 108a function as lightly doped drain (LDD) regions which have lower resistance than the channel formation region 126. The regions 128a and 128b containing the dopant function as a source region and a drain region which have lower resistance than the LDD regions. The existence of the regions 122a and 122b containing the dopant which function as the LDD regions can relax an electric field applied to an end portion of the channel formation region 126. Thus, a short-channel effect of the transistor can be suppressed. Note that the present invention is not limited to this embodiment, and the LDD regions do not necessarily need to be provided.

In the oxide semiconductor film 108a, the concentration of the dopant in the regions 122a, 122b, 128a, and 128b containing the dopant is higher than or equal to $5 \times 10^{18}$ atoms/cm$^3$ and lower than or equal to $1 \times 10^{22}$ atoms/cm$^3$, preferably higher than or equal to $5 \times 10^{18}$ atoms/cm$^3$ and lower than $5 \times 10^{20}$ atoms/cm$^3$. Note that an excessively high concentration of dopant inhibits carrier movement, which leads to a decrease in conductivity of the regions 122a and 122b containing the dopant and the regions 128a and 128b containing the dopant.

In the case where the regions 122a and 122b containing the dopant are provided as the LDD regions and the regions 128a and 128b containing the dopant are provided as the source region and the drain region, the concentration of the dopant in the regions 128a and 128b containing the dopant is preferably higher than that in the regions 122a and 122b containing the dopant.

The conductivity of the regions 122a and 122b containing the dopant is preferably higher than or equal to $1 \times 10^6$ Ω/sq and lower than or equal to $1 \times 10^8$ Ω/sq.

In this embodiment, oxygen vacancies are reduced in the channel formation region 126 of the oxide semiconductor film 108a of the transistor 200. Thus, generation of carriers which results from oxygen vacancies can be suppressed; therefore, shift of the threshold voltage of the transistor 200 can be suppressed. Because the side surfaces of the oxide semiconductor film 108a are in contact with the insulating films 112a and 112b, the side surfaces of the oxide semiconductor film 108a are not in contact with the source electrode and the drain electrode, which makes it possible to prevent electric current from easily flowing along the side surfaces of the oxide semiconductor film 108a. Thus, the off-state current of the transistor 200 can be reduced.

In the above-described manner, the transistor 200 having electrical characteristics which are favorable and less likely to fluctuate can be manufactured.

In this embodiment, the transistor in which a region between the source electrode and the drain electrode has a rectangular shape in a top view is described; however, the region between the source electrode and the drain electrode may have an U shape, a C shape, or the like in a top view as appropriate. A channel width of a transistor having such a shape can be increased, leading to an increase in on-state current.

<Method for Manufacturing Semiconductor Device>

Next, a method for manufacturing the transistor illustrated in FIGS. 1A to 1C will be described with reference to FIGS. 2A to 2D, FIGS. 3A to 3D, FIGS. 4A to 4D, and FIGS. 5A to 5D.

Figure 2A:
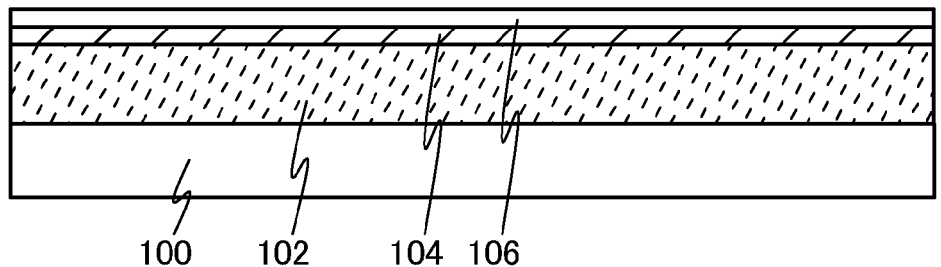
FIGS. 2A to 2D are cross-sectional views illustrating a method for manufacturing a semiconductor device according to an embodiment of the present invention.

First, an insulating film 102, an oxide semiconductor film 104, and an insulating film 106 are sequentially formed over the substrate 100 (see FIG. 2A).

There is no particular limitation on a material and the like of the substrate 100 as long as the material has heat resistance high enough to withstand at least heat treatment to be performed later. For example, a glass substrate, a ceramic substrate, a quartz substrate, a sapphire substrate, or the like may be used as the substrate 100. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used as the substrate 100. Still alternatively, any of these substrates further provided with a semiconductor element may be used as the substrate 100. In this embodiment, the case where a glass substrate is used as the substrate 100 is described.

A flexible substrate can also be used as the substrate 100. For example, a separation layer is provided between a substrate different from the substrate 100 and the insulating film 102, and part or the whole of a semiconductor device is completed over the separation layer. Then, the substrate 100 is attached to an upper surface of the semiconductor device, and the semiconductor device is separated from the substrate along the separation layer. In this manner, the semiconductor device can be provided over the flexible substrate 100.

The insulating film 102 is formed by a sputtering method, a CVD method, or the like. The insulating film 102 is preferably an insulating film from which oxygen is released by application of heat. An insulating film which contains oxygen at a proportion exceeding the stoichiometric proportion is preferably used as the insulating film from which oxygen is released by application of heat. When the insulating film from which oxygen is released by application of heat is subjected to heat treatment, oxygen can be released and the released oxygen can be diffused into (or supplied to) an oxide semiconductor film to be formed later.

Examples of the insulating film 102 include films of silicon oxide, silicon oxynitride, silicon nitride oxide, aluminum oxide, aluminum oxynitride, gallium oxide, hafnium oxide, yttrium oxide, and the like. The insulating film 102 formed by a sputtering method can easily release oxygen by application of heat, which is preferable.

The thickness of the insulating film 102 is greater than or equal to 50 nm and less than or equal to 800 nm, preferably greater than or equal to 200 nm and less than or equal to 500 nm. With the use of the thick insulating film 102, the amount of oxygen released from the insulating film 102 can be increased, and the number of defect levels generated at the interface between the insulating film 102 and an oxide semiconductor film to be formed later can be reduced.

The insulating film 102 may have a single-layer structure or a stacked-layer structure. For example, a single layer of a silicon oxide film may be provided, or a silicon oxide film may be stacked over an aluminum oxide film and a silicon nitride oxide film. An aluminum oxide film and a silicon nitride oxide film can serve as a blocking film. Accordingly, an impurity contained in the substrate 100 can be blocked by the aluminum oxide film and the silicon nitride oxide film, so that the impurity can be prevented from entering an oxide semiconductor film to be formed later. In this embodiment, the case where a silicon oxide film having a thickness of 300 nm is formed as the insulating film 102 by a sputtering method is described.

In the case of forming the insulating film 102 by a sputtering method, an oxygen gas, a mixed gas of oxygen and a rare gas, or the like can be used as a deposition gas. Further, when the amount of oxygen in the deposition gas is large, the amount of oxygen contained in the insulating film 102 can be increased, which is preferable. For example, the oxygen concentration of the deposition gas is preferably higher than or equal to 6% and lower than or equal to 100%.

In the case where a silicon oxide film is formed as the insulating film 102, an RF sputtering method is preferably used under the following conditions: quartz (preferably synthetic quartz) is used as a target; the substrate temperature is higher than or equal to 30° C. and lower than or equal to 450° C. (preferably higher than or equal to 70° C. and lower than or equal to 200° C.); the distance between the substrate and the target (the T-S distance) is greater than or equal to 20 mm and less than or equal to 400 mm (preferably greater than or equal to 40 mm and less than or equal to 200 mm); the pressure is higher than or equal to 0.1 Pa and lower than or equal to 4 Pa (preferably higher than or equal to 0.2 Pa and lower than or equal to 1.2 Pa); the high-frequency power is higher than or equal to 0.5 kW and lower than or equal to 12 kW (preferably higher than or equal to 1 kW and lower than or equal to 5 kW); and the proportion of $O_2/(O_2+Ar)$ in the deposition gas is higher than or equal to 1% and lower than or equal to 100% (preferably higher than or equal to 6% and lower than or equal to 100%). Note that a silicon target may be used as the target instead of the quartz (preferably synthetic quartz) target. In addition, oxygen alone may be used as the deposition gas.

The oxide semiconductor film 104 can be formed by a sputtering method, a coating method, a printing method, a pulsed laser deposition method, or the like. The thickness of the oxide semiconductor film 104 is greater than or equal to 1 nm and less than or equal to 50 nm, preferably greater than or equal to 3 nm and less than or equal to 30 nm.

The oxide semiconductor film 104 contains at least one element selected from In, Ga, Sn, and Zn. Such an oxide semiconductor film can be formed using a target of a four-component metal oxide such as an In—Sn—Ga—Zn—O-based metal oxide; a three-component metal oxide such as an In—Ga—Zn—O-based metal oxide, an In—Sn—Zn—O-based metal oxide, an In—Al—Zn—O-based metal oxide, a Sn—Ga—Zn—O-based metal oxide, an Al—Ga—Zn—O-based metal oxide, or a Sn—Al—Zn—O-based metal oxide; a two-component metal oxide such as an In—Zn—O-based metal oxide or a Sn—Zn—O-based metal oxide; a one-component metal oxide such as a Zn—O-based metal oxide or a Sn—O-based metal oxide; or the like. In addition, the oxide semiconductor film 104 may contain an element other than In, Ga, Sn, and Zn, for example, $SiO_2$.

For example, an In—Ga—Zn—O-based oxide semiconductor means an oxide semiconductor containing indium (In), gallium (Ga), and zinc (Zn), and there is no limitation on the composition ratio.

In addition, as the oxide semiconductor film 104, a thin film of a material represented by the chemical formula, $InMO_3(ZnO)_m$ (m>0), can be used. Here, M represents one or more metal elements selected from Zn, Ga, Al, Mn, and Co. For example, M may be Ga, Ga and Al, Ga and Mn, Ga and Co, or the like.

In the case where an In—Ga—Zn—O-based material is used for the oxide semiconductor film 104, an example of the target is a metal oxide target containing In, Ga, and Zn at a composition ratio of $In_2O_3:Ga_2O_3:ZnO=1:1:1$ [molar ratio]. Alternatively, a target having a composition ratio of $In_2O_3:Ga_2O_3:ZnO=1:1:2$ [molar ratio], a target having a composition ratio of $In_2O_3:Ga_2O_3:ZnO=1:1:4$ [molar ratio], or a target having a composition ratio of $In_2O_3:Ga_2O_3:ZnO=2:1:8$ [molar ratio] can be used.

In the case where an In—Zn—O-based material is used for the oxide semiconductor film 104, a target therefor has a composition ratio of In:Zn=50:1 to 1:2 in an atomic ratio ($In_2O_3:ZnO=25:1$ to 1:4 in a molar ratio), preferably, In:Zn=20:1 to 1:1 in an atomic ratio ($In_2O_3:ZnO=10:1$ to 1:2 in a molar ratio), further preferably, In:Zn=15:1 to 1.5:1 in an atomic ratio ($In_2O_3:ZnO=15:2$ to 3:4 in a molar ratio). For example, in a target used for formation of an In—Zn—O-based oxide semiconductor which has an atomic ratio of In:Zn:O=X:Y:Z, the relation of Z>1.5 X+Y is satisfied.

Next, a sputtering apparatus used for forming the oxide semiconductor film 104 is described in detail.

The leakage rate of a treatment chamber used for forming the oxide semiconductor film 104 is preferably lower than or equal to $1 \times 10^{-10}$ Pa·m$^3$/second. Thus, entry of an impurity including hydrogen into a film to be formed by a sputtering method can be decreased.

In order to decrease the leakage rate, internal leakage as well as external leakage needs to be reduced. The external leakage is due to inflow of gas from the outside of a vacuum system through a minute hole, a sealing defect, or the like. The internal leakage is due to leakage through a partition, such as a valve, in a vacuum system or due to released gas from an internal member. Measures need to be taken from both aspects of external leakage and internal leakage in order that the leakage rate be lower than or equal to $1 \times 10^{-10}$ Pa·m$^3$/second.

In order to reduce external leakage, an open/close portion of the treatment chamber is preferably sealed with a metal gasket. For the metal gasket, a metal material covered with iron fluoride, aluminum oxide, or chromium oxide is preferably used. The metal gasket realizes higher adhesion than an O-ring, and can reduce the external leakage. Further, by use of a metal material covered with iron fluoride, aluminum oxide, chromium oxide, or the like which is in the passive state, released gas containing hydrogen generated from the metal gasket is suppressed, so that the internal leakage can also be reduced.

As a member forming an inner wall of the treatment chamber, aluminum, chromium, titanium, zirconium, nickel, or vanadium, from which only a small amount of gas containing hydrogen is released, is used. An alloy material containing iron, chromium, nickel, and the like covered with the above-mentioned material may be used. The alloy material containing iron, chromium, nickel, and the like is rigid, resistant to heat, and suitable for processing. Here, when surface unevenness of the member is decreased by polishing or the like to reduce the surface area, the released gas can be reduced. Alternatively, the above-mentioned member of the sputtering apparatus may be covered with iron fluoride, aluminum oxide, chromium oxide, or the like which is in the passive state.

Furthermore, it is preferable to provide a gas refiner for a sputtering gas just in front of the treatment chamber. At this time, the length of a pipe between the gas refiner and the treatment chamber is less than or equal to 5 m, preferably less than or equal to 1 m. When the length of the pipe is less than or equal to 5 m or less than or equal to 1 m, the effect of the released gas from the pipe can be reduced accordingly.

Evacuation of the treatment chamber is preferably performed with a rough vacuum pump, such as a dry pump, and a high vacuum pump, such as a sputter ion pump, a turbo molecular pump, or a cryopump, in appropriate combination. The turbo molecular pump has an outstanding capability in evacuating a large-sized molecule, whereas it has a low capability in evacuating hydrogen or water. Hence, the use in combination with a cryopump having a high capability in evacuating water or a sputter ion pump having a high capability in evacuating hydrogen is effective.

An adsorbate present at the inner wall of the treatment chamber does not affect the pressure in the treatment chamber because it is adsorbed on the inner wall, but the adsorbate leads to release of gas at the time of the evacuation of the treatment chamber. Therefore, although the leakage rate and the evacuation rate do not have a correlation, it is important that the adsorbate present in the treatment chamber be desorbed as much as possible and evacuation be performed in advance with the use of a pump having high evacuation capability. Note that the treatment chamber may be subjected to baking for promotion of desorption of the adsorbate. By the baking, the rate of desorption of the adsorbate can be increased about tenfold. The baking may be performed at a temperature greater than or equal to 100° C. and less than or equal to 450° C. At this time, when the adsorbate is removed while an inert gas is introduced, the rate of desorption of water or the like, which is difficult to desorb simply by evacuation, can be further increased.

As described above, in the process for forming the oxide semiconductor film 104 and preferably in the process for forming the insulating film 102, entry of an impurity including hydrogen is suppressed as much as possible through control of the pressure of the treatment chamber, leakage rate of the treatment chamber, and the like, whereby entry of an impurity including hydrogen into the oxide semiconductor film 104 can be reduced. In addition, diffusion of an impurity including hydrogen from the insulating film 102 into the oxide semiconductor film 104 can be reduced.

Hydrogen contained in an oxide semiconductor film becomes water by reacting with oxygen bonded to a metal atom, and in addition, a defect is formed in a lattice from which oxygen is released (or in a portion from which oxygen is released). For the prevention of the foregoing, it is important to reduce defects in the oxide semiconductor film by reducing the impurity including hydrogen as much as possible in the process for forming the oxide semiconductor film.

In a sputtering method, an RF power supply device, an AC power supply device, a DC power supply device, or the like can be used as appropriate as a power supply device for generating plasma.

As a sputtering gas, a rare gas (typically argon) atmosphere, an oxygen atmosphere, or a mixed gas of a rare gas and oxygen is used as appropriate. It is preferable that a high-purity gas from which an impurity including hydrogen is removed be used as a sputtering gas.

In this embodiment, the case where an In—Ga—Zn—O-based metal oxide film having a thickness of 20 nm is formed as the oxide semiconductor film 104 by a sputtering method is described.

The oxide semiconductor film 104 is formed to a thickness of 20 nm over the insulating film 102 in such a manner that the substrate is held in the treatment chamber kept at reduced pressure, a sputtering gas from which an impurity such as hydrogen is removed is introduced into the treatment chamber while residual moisture therein is removed, and an In—Ga—Zn—O-based metal oxide is used as a target. The substrate temperature may be in the range of 100° C. to 600° C., preferably 200° C. to 400° C. during the film formation. By heating the substrate during the film formation, the concentration of an impurity such as hydrogen contained in the oxide semiconductor film 104 can be decreased. Furthermore, damage due to sputtering can be reduced.

As an example of the film formation conditions, the following conditions are employed: the distance between the substrate and the target is 100 mm; the substrate temperature is 300° C.; the pressure is 0.4 Pa; the direct current (DC) power is 0.5 kW; and the atmosphere is an oxygen atmosphere (the proportion of oxygen flow is 100%). Under the above film formation conditions, the oxide semiconductor film 104 including a c-axis aligned crystal can be formed. Note that a pulsed direct-current (DC) power source is preferable because dust, called particles, generated in film formation can be reduced and the film thickness can be made uniform.

The insulating film 106 can be formed using a method and a material similar to those for the insulating film 102. In this embodiment, a silicon oxide film having a thickness of 30 nm is formed as the insulating film 106 by a sputtering method.

Note that it is preferable that the insulating film 102, the oxide semiconductor film 104, and the insulating film 106 be successively formed. When the oxide semiconductor film 104 and the insulating film 106 are formed without being exposed to air after formation of the insulating film 102, attachment of hydrogen to the interface between the insulating film 102 and the oxide semiconductor film 104 and the interface between the oxide semiconductor film 104 and the insulating film 106 can be reduced. Alternatively, in a multi-chamber sputtering apparatus with a heating apparatus, the insulating film 102 may be formed, the insulating film 102 may be heated with the heating apparatus to release hydrogen, and then the oxide semiconductor film 104 may be formed over the insulating film 102.

In the process for forming the insulating film 102, the oxide semiconductor film 104, and the insulating film 106, entry of an impurity including hydrogen is suppressed as much as possible through control of the pressure of the treatment chamber, leakage rate of the treatment chamber, and the like, whereby entry of an impurity including hydrogen into the insulating film 102, the oxide semiconductor film 104, and the insulating film 106 can be reduced. Furthermore, diffusion of an impurity including hydrogen from the insulating film 102 into the oxide semiconductor film 104 and from the insulating film 106 into the oxide semiconductor film 104 can be reduced.

Figure 2B:
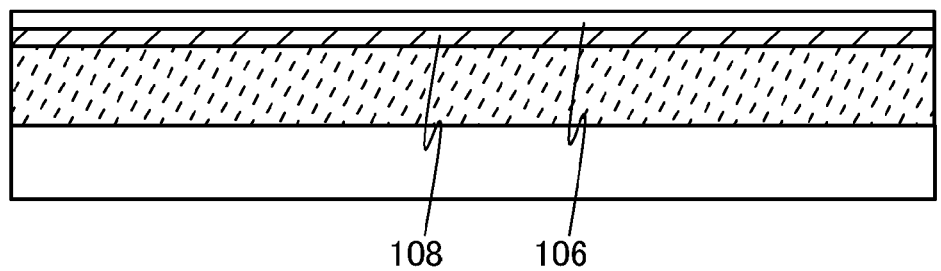

Next, the substrate 100 is subjected to heat treatment, so that hydrogen is released from the oxide semiconductor film 104 and oxygen contained in the insulating film 102 and the insulating film 106 is diffused into the oxide semiconductor film 104, the vicinity of the interface between the insulating film 102 and the oxide semiconductor film 104, and the vicinity of the interface between the oxide semiconductor film 104 and the insulating film 106. As a result, as illustrated in FIG. 2B, an oxide semiconductor film 108 in which the hydrogen concentration and oxygen vacancies are reduced can be formed. In addition, interface states at the interface between the insulating film 102 and the oxide semiconductor film 108 can be reduced.

The temperature of the heat treatment is preferably a temperature at which hydrogen is released from the oxide semiconductor film 104 and oxygen contained in the insulating film 102 and the insulating film 106 is released and diffused into the oxide semiconductor film 104. The temperature is, for example, higher than or equal to 150° C. and lower than the strain point of the substrate, preferably higher than or equal to 250° C. and lower than or equal to 450° C., more preferably higher than or equal to 300° C. and lower than or equal to 450° C.

A rapid thermal annealing (RTA) apparatus can be used in the heat treatment. With the use of the RTA apparatus, the heat treatment can be performed at a temperature higher than or equal to the strain point of the substrate 100 if the heating time is short. Therefore, time to release hydrogen from the oxide semiconductor film 104 and to diffuse oxygen from the insulating film 102 and the insulating film 106 into the oxide semiconductor film 104 can be shortened.

The heat treatment can be performed in an inert gas atmosphere; for example, the heat treatment is preferably performed in a rare gas (such as helium, neon, argon, xenon, or krypton) atmosphere or a nitrogen atmosphere. Alternatively, the heat treatment may be performed in an oxygen atmosphere or a reduced-pressure atmosphere. The treatment time is from 3 minutes to 24 hours.

When heat treatment is performed while the oxide semiconductor film 104 is interposed between the insulating film 102 and the insulating film 106 as described in this embodiment, oxygen contained in the insulating film 102 and the insulating film 106 is diffused into the oxide semiconductor film 104, so that oxygen vacancies in the oxide semiconductor film 108 can be reduced. Further, the insulating film 102 is covered with the oxide semiconductor film 104 and a surface of the insulating film 102 is not exposed, so that oxygen released from the insulating film 102 can be efficiently diffused into the oxide semiconductor film 104. Accordingly, oxygen vacancies in the oxide semiconductor film 108 and interface states at the interface between the insulating film 102 and the oxide semiconductor film 108 can be reduced. Moreover, the hydrogen concentration in the oxide semiconductor film 108 can be reduced by the heat treatment. Accordingly, the oxide semiconductor film 108 can be made to be an i-type (intrinsic) semiconductor or a semiconductor extremely close to an i-type semiconductor.

Figure 2C:
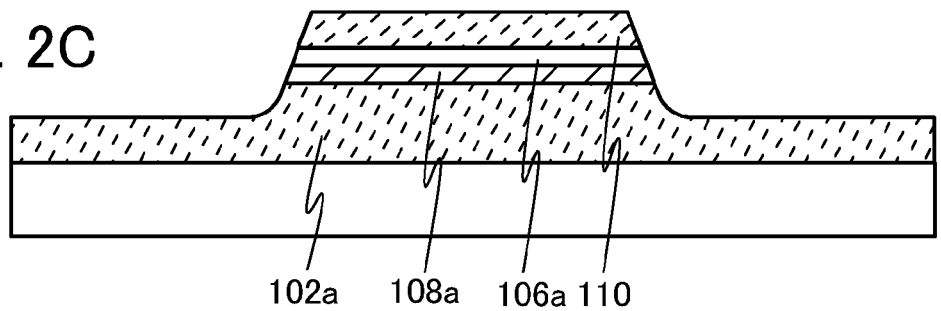

Next, after formation of a mask 110 over the insulating film 106, the insulating film 106, the oxide semiconductor film 108, and the insulating film 102 are selectively etched with the use of the mask 110 to form an insulating film 106a, the oxide semiconductor film 108a, and the insulating film 102a having an island shape (see FIG. 2C). Accordingly, an element isolation region of the insulating film 106, the oxide semiconductor film 108, and the insulating film 102 is etched away, so that an element isolation groove is formed in the insulating film 106, the oxide semiconductor film 108, and the insulating film 102.

The mask 110 used in etching of the insulating film 106, the oxide semiconductor film 108, and the insulating film 102 can be formed as appropriate by a photolithography process, an inkjet method, a printing method, or the like.

Wet etching or dry etching can be used in etching of the oxide semiconductor film 108, or wet etching and dry etching may be used in combination. In addition, etching is preferably performed so that an end portion of the oxide semiconductor film 108a has a tapered shape. In the case of using a photolithography process, the tapered shape can be obtained by etching while removing the resist mask. Note that it is preferable that impurities including hydrogen not be included in the etching.

An example of an etchant which can be used for wet etching is a mixed solution of phosphoric acid, acetic acid, and nitric acid, an ammonia hydrogen peroxide mixture (hydrogen peroxide solution of 31 wt %:ammonia solution of 28 wt %:water=5:2:2 (in a volume ratio)), or the like. In addition, ITO-07N (produced by KANTO CHEMICAL CO., INC.) may be used.

As an etching gas for dry etching, a gas containing chlorine (a chlorine-based gas such as chlorine ($Cl_2$), boron trichloride ($BCl_3$), silicon tetrachloride ($SiCl_4$), or carbon tetrachloride ($CCl_4$)) is preferably used. Alternatively, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), methane ($CH_4$), oxygen ($O_2$), any of these gases to which a rare gas such as helium (He) or argon (Ar) is added, or the like can be used.

As a dry etching method, a parallel plate reactive ion etching (RIE) method, an inductively coupled plasma (ICP) etching method, or the like can be used. In order to process the film into a desired shape, the etching conditions (the amount of electric power applied to a coil-shaped electrode, the amount of electric power applied to an electrode on a substrate side, the temperature of the electrode on the substrate side, or the like) are adjusted as appropriate.

For example, dry etching is performed under the following conditions: the ICP power is 450 W and the bias power is 100 W; the pressure is 1.9 Pa; the etching gas is a mixed gas of $BCl_3$ and $Cl_2$; and the flow rate of $BCl_3$ is 60 sccm and the flow rate of $Cl_2$ is 20 sccm. When dry etching is performed under such conditions, the insulating film 102 can be selectively removed after the insulating film 106 and the oxide semiconductor film 108 are formed into an island shape, whereby the insulating film 106a, the oxide semiconductor film 108a, and the insulating film 102a can be formed.

Although the depth to which the insulating film 102 is removed depends on the thickness of the insulating film 102, the insulating film 102 is preferably removed by 100 nm in depth in the case where the thickness of the insulating film 102 is 300 nm, for example. After the removal, the side surface of the insulating film 102a may be perpendicular to the substrate 100 or may be at an angle thereto.

After that, the mask 110 is removed. Note that when a stripping solution is used for removing the mask 110, oxygen may be released from a side surface of the oxide semiconductor film 108a in some cases. Therefore, an ashing method may alternatively be used for removing the mask 110.

When the oxide semiconductor film 108 is selectively etched, for example when side surfaces of the oxide semiconductor film are exposed to plasma including chlorine radicals, fluorine radicals, or the like in dry etching, metal atoms exposed on the side surfaces of the oxide semiconductor film are bonded with the chlorine radicals, the fluorine radicals, or the like. At this time, the metal atoms bonded with the chlorine atoms or the fluorine atoms are released and consequently oxygen atoms whose bonds to the metal atoms are broken in the oxide semiconductor film become active. The active oxygen atoms are easily reacted and released. Thus, oxygen vacancies are likely to be created at the side surfaces of the oxide semiconductor film.

When the side surfaces of the oxide semiconductor film exposed in the etching step are active, oxygen is extracted in a reduced-pressure atmosphere or a reducing atmosphere, or in heat treatment in a reduced-pressure atmosphere, and oxygen vacancies are created at the side surfaces of the oxide semiconductor film. Some of the oxygen vacancies become donors and generate electrons which are carriers, so that the side surfaces of the oxide semiconductor film have n-type conductivity. A source electrode and a drain electrode of the transistor are in contact with the side surfaces of the oxide semiconductor film having n-type conductivity, so that leakage current is generated between the source electrode and the drain electrode through the side surfaces of the oxide semiconductor film. The leakage current increases the off-state current of the transistor. Further, there is a possibility that current flowing through the side surface of the oxide semiconductor film causes formation of a transistor in which the side surface of the oxide semiconductor film serves as a channel formation region.

In short, it can be said that side surfaces of the oxide semiconductor film 108a which are exposed in the etching step are active and oxygen vacancies are created at the side surfaces.

Figure 2D:
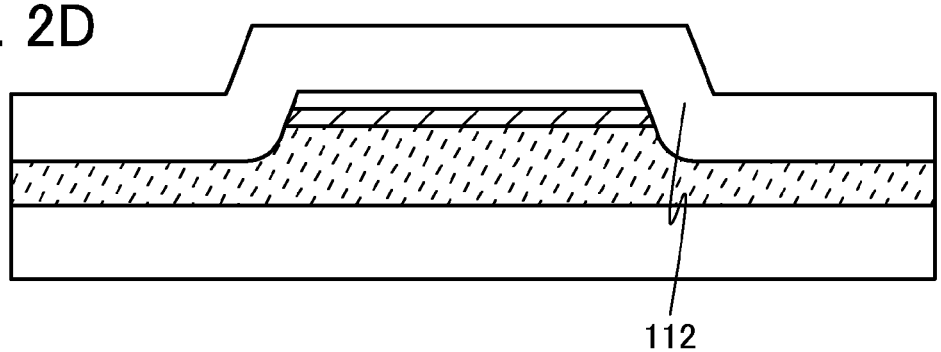

Next, an insulating film 112 is formed over the insulating film 102a and the oxide semiconductor film 108a (see FIG. 2D). Like the insulating film 102 and the insulating film 106, the insulating film 112 may be formed using an insulating film from which oxygen is released by application of heat. In addition, an insulating film capable of preventing oxygen from being released from the side surfaces of the oxide semiconductor film 108a is preferably used as the insulating film 112. In this case, an aluminum oxide film can be used as the insulating film 112. Further, the insulating film 112 can be formed using a film formation method and a material similar to those for the insulating film 102 as appropriate. Note that it is preferable that the insulating film 112 be formed at temperature as low as possible, preferably at room temperature, in order to reduce the amount of oxygen released from the side surfaces of the oxide semiconductor film 108a when the insulating film 112 is formed. Furthermore, a silicon nitride film, an aluminum nitride film, or the like formed by a sputtering method can be used as the insulating film 112.

In this embodiment, the case where the insulating film 112 is a single-layer aluminum oxide film is described. Note that the present invention is not limited to this embodiment, and the insulating film 112 may be a stack of two or more layers.

Figure 3A:
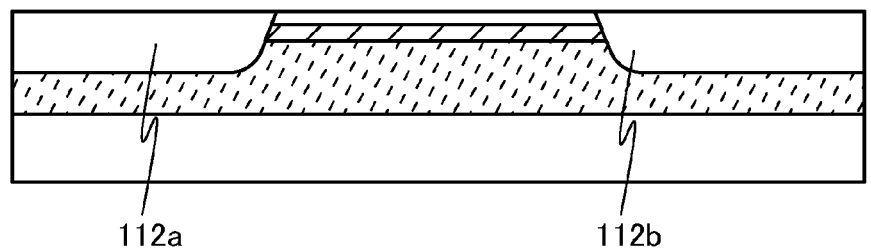
FIGS. 3A to 3D are cross-sectional views illustrating a method for manufacturing a semiconductor device according to an embodiment of the present invention.

Next, the insulating film 112 is subjected to planarization treatment to form the insulating films 112a and 112b (see FIG. 3A). Accordingly, the insulating films 112a and 112b can be embedded in the element isolation groove formed in the insulating film 102a. Note that the insulating films 112a and 112b embedded in the element isolation groove are also referred to as element isolation insulating films.

The planarization treatment can be performed by polishing treatment such as a chemical mechanical polishing (CMP) method, etching treatment such as dry etching or wet etching, or a combination of polishing treatment and etching treatment. Here, the case where the insulating film 112 is subjected to CMP treatment as the planarization treatment is described. The planarization treatment is performed on the insulating film 112 until the insulating film 106a is exposed or the surface of the insulating film 112 is level with the surface of the insulating film 106a. Since the oxide semiconductor film 108a is as thin as several nanometers to several tens of nanometers, it is preferable that the oxide semiconductor film 108a not be removed by the planarization treatment.

For example, the insulating film 112 is subjected to CMP treatment under the following conditions: a polyurethane polishing cloth and silica-based slurry (a grain size of 60 nm) are used; the slurry flow rate is greater than or equal to 100 ml/min and less than or equal to 500 ml/min; the polishing pressure is higher than or equal to 0.005 MPa and lower than or equal to 0.08 MPa; the spindle rotational speed is greater than or equal to 20 rpm and less than or equal to 50 rpm; the table rotational speed is greater than or equal to 20 rpm and less than or equal to 50 rpm; and the treatment time is 0.2 minutes.

With the insulating films 112a and 112b provided in contact with the side surfaces of the oxide semiconductor film 108a, oxygen can be prevented from being released from the side surfaces of the oxide semiconductor film 108a. Furthermore, aluminum oxide films have high resistance to dry etching. Therefore, when provided in contact with the side surfaces of the oxide semiconductor film 108a, the aluminum oxide films can prevent the side surfaces of the oxide semiconductor film 108a from being exposed during a transistor manufacturing process. Thus, oxygen vacancies can be prevented from being created at the side surfaces of the oxide semiconductor film 108a.

Figure 3B:
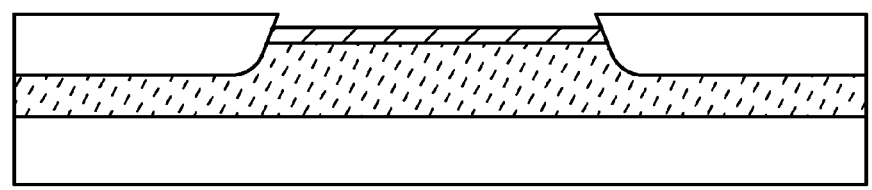

Next, the exposed portion of the insulating film 106a is removed, so that the surface of the oxide semiconductor film 108a is exposed (see FIG. 3B). The insulating film 106a is removed by etching treatment. Since the oxide semiconductor film 108a is as thin as several nanometers to several tens of nanometers, the etching condition where the etching selectivity of the insulating film 106a to the oxide semiconductor film 108a is high needs to be employed. The surface of the oxide semiconductor film 108a is planarized after the exposed portion of the insulating film 106a is removed, so that electrical characteristics of the transistor can be improved.

For example, dry etching is performed under the following conditions: the ICP power is 500 W and the bias power is 50 W; the pressure is 1.5 Pa; the etching gas is a mixed gas of $CF_4$ and $O_2$; and the flow rate of $CF_4$ is 70 sccm and the flow rate of $O_2$ is 30 sccm. When dry etching is performed under such conditions, the insulating film 106a can be selectively removed. Further, the oxide semiconductor film 108a can be prevented from being removed. It is preferable that impurities including hydrogen not be included in the etching.

Here, heat treatment may be performed. Through the heat treatment, impurities including hydrogen in the oxide semiconductor film 108a can be removed. In addition, oxygen is released from the insulating film 102a, whereby oxygen can be supplied to the oxide semiconductor film 108a from the interface between the insulating film 102a and the oxide semiconductor film 108a; thus, oxygen vacancies can be reduced in the oxide semiconductor film 108a.

Figure 3C:
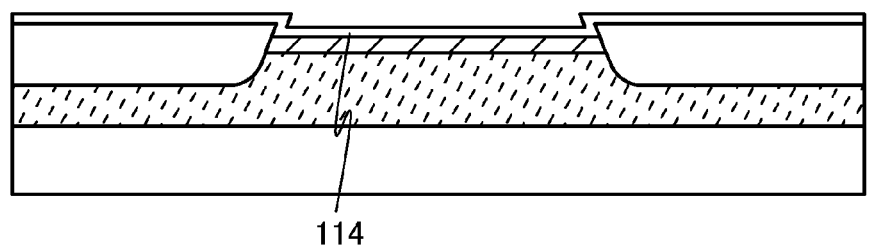

Next, an insulating film 114 is formed over the oxide semiconductor film 108a and the insulating films 112a and 112b (see FIG. 3C). The insulating film 114 is later processed into a gate insulating film. The insulating film 114 is preferably formed using an insulating film from which oxygen is released by application of heat, like the insulating film 102. Alternatively, the insulating film 114 is formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide, so that gate leakage can be reduced. Note that the insulating film 114 is formed by a sputtering method when formed using a high-k material.

The insulating film 114 can be formed by a film formation method similar to that for the insulating film 102 as appropriate. The thickness of the insulating film 114 is preferably greater than or equal to 1 nm and less than or equal to 300 nm, more preferably greater than or equal to 5 nm and less than or equal to 50 nm. Note that it is preferable that the insulating film 114 be formed at temperature as low as possible, preferably at room temperature, in order to reduce the amount of oxygen released from the surface of the oxide semiconductor film 108a when the insulating film 114 is formed. In this embodiment, a silicon oxynitride film having a thickness of 15 nm is formed as the insulating film 114 by a CVD method.

Figure 3D:
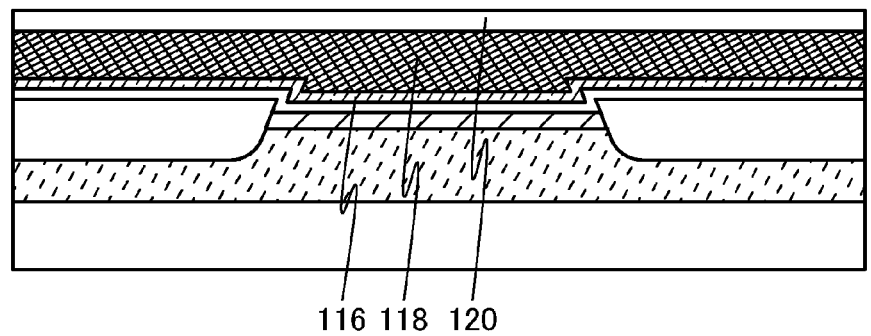

Next, a conductive film 116, a conductive film 118, and an insulating film 120 are formed (see FIG. 3D). The conductive film 116 and the conductive film 118 are later processed into a gate electrode. The conductive film 116 and the conductive film 118 are formed by a sputtering method, a CVD method, an evaporation method, or the like. The conductive film 116 and the conductive film 118 can be formed using a metal element selected from aluminum, chromium, copper, tantalum, titanium, molybdenum, and tungsten, an alloy containing any of these metal elements as a component, an alloy containing any of these metal elements in combination, or the like. Further, one or more metal elements selected from manganese and zirconium may be used. Alternatively, a film, an alloy film, or a nitride film which contains aluminum and one or more elements selected from titanium, tantalum, tungsten, molybdenum, chromium, neodymium, and scandium may be used.

Examples of combinations of the conductive film 116 and the conductive film 118 are as follows: a two-layer structure in which a titanium film is stacked over an aluminum film; a two-layer structure in which a titanium film is stacked over a titanium nitride film; a two-layer structure in which a tungsten film is stacked over a titanium nitride film; and the like. Although the case where the gate electrode has a two-layer structure of the conductive film 116 and the conductive film 118 is described in this embodiment, the present invention is not limited to this embodiment. The gate electrode may have a single-layer structure or a stacked-layer structure of three or more layers. In the case where the gate electrode has a single-layer structure, an aluminum film containing silicon can also be used. In the case where the gate electrode has a three-layer structure, an aluminum film may be stacked over a titanium film, and another titanium film may be stacked over the aluminum film.

For the conductive film 116 and the conductive film 118, a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can also be used. Furthermore, the conductive film 116 and the conductive film 118 can have a stacked-layer structure formed using the above light-transmitting conductive material and the above metal element.

As the conductive film 116, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a film of a metal nitride (such as InN or ZnN) may be provided. These films each have a work function of 5 eV or higher, preferably 5.5 eV or higher; thus, the threshold voltage of the transistor can be positive. Accordingly, a so-called normally-off switching element can be obtained. For example, in the case of using an In—Ga—Zn—O film containing nitrogen, an In—Ga—Zn—O film having at least a higher nitrogen concentration than the oxide semiconductor film 108a, or specifically, an In—Ga—Zn—O film having a nitrogen concentration of 7 at. % or higher can be used.

The insulating film 120 can be formed using a material and a film formation method similar to those for the insulating film 102. The thickness of the insulating film 120 is greater than or equal to 10 nm and less than or equal to 150 nm.

In this embodiment, a tantalum nitride film having a thickness of 300 nm is formed as the conductive film 116 by a sputtering method; a tungsten film having a thickness of 135 nm is formed as the conductive film 118 by a sputtering method; and a silicon oxynitride film having a thickness of 200 nm is formed as the insulating film 120 by a PCVD method. It is preferable that the conductive film 116, the conductive film 118, and the insulating film 120 be successively formed.

Figure 4A:
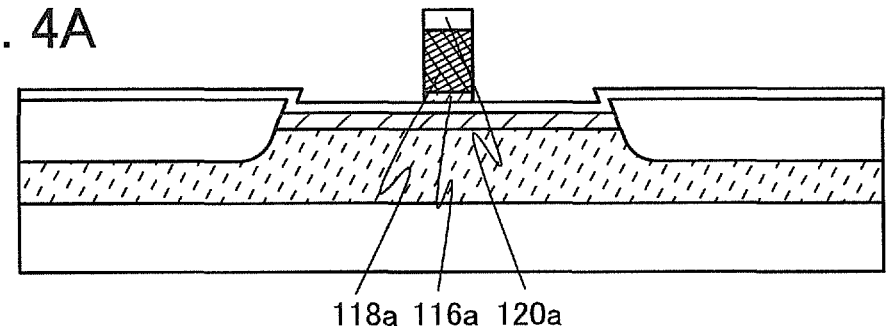
FIGS. 4A to 4D are cross-sectional views illustrating a method for manufacturing a semiconductor device according to an embodiment of the present invention.

Next, a mask is formed over the insulating film 120, and the conductive film 116, the conductive film 118, and the insulating film 120 are etched to form the conductive film 116a, the conductive film 118a, and the insulating film 120a (see FIG. 4A). The conductive film 116a and the conductive film 118a function as the gate electrode. With the insulating film 120a, a short circuit between the gate electrode and the source and drain electrodes to be formed later can be prevented. A mask formed with an inorganic material (so called hard mask) is used as the mask that is formed over the insulating film 120. For example, silicon oxynitride, silicon nitride oxide, or the like can be used for the mask. Note that the mask may be formed over the insulating film 120 by a printing method, an inkjet method, or a photolithography method as appropriate. Note that the mask is removed after the formation of the conductive film 116a, the conductive film 118a, and the insulating film 120a.

Wet etching or dry etching can be used in etching of the conductive film 116, the conductive film 118, and the insulating film 120, or wet etching and dry etching may be used in combination. The etching conditions (e.g., an etching gas or an etchant, etching time, and temperature) are set as appropriate in accordance with the material so that the conductive film 116, the conductive film 118, and the insulating film 120 can be etched into a desired shape. Note that, in order to process the channel length (L) of the transistor minutely, dry etching is preferably used.

Dry etching of the insulating film 120 is performed under the following conditions: the ICP power is 475 W and the bias power is 300 W; the pressure is 3.5 Pa; the substrate temperature is 70° C.; the etching gas is a mixed gas of $CHF_3$, He, and $CH_4$; and the flow rate of $CHF_3$ is 22.5 sccm, the flow rate of He is 127.5 sccm, and the flow rate of $CH_4$ is 5 sccm. Dry etching of the conductive film 118 is performed under the following conditions: the ICP power is 3000 W and the bias power is 110 W; the pressure is 0.67 Pa; the substrate temperature is 40° C.; the etching gas is a mixed gas of $Cl_2$, $CF_4$, and $O_2$; and the flow rate of $Cl_2$ is 45 sccm, the flow rate of $CF_4$ is 55 sccm, and the flow rate of $O_2$ is 55 sccm. Dry etching of the conductive film 116 is performed under the following conditions: the ICP power is 1000 W and the bias power is 25 W; the pressure is 2.0 Pa; the substrate temperature is −10° C.; the etching gas is a $Cl_2$ gas; and the flow rate of $Cl_2$ is 100 sccm. When dry etching is performed under such conditions, the conductive film 116, the conductive film 118, and the insulating film 120 can be selectively removed. Further, the insulating film 114 can be prevented from being removed. It is preferable that impurities including hydrogen not be included in the etching.

Figure 4B:
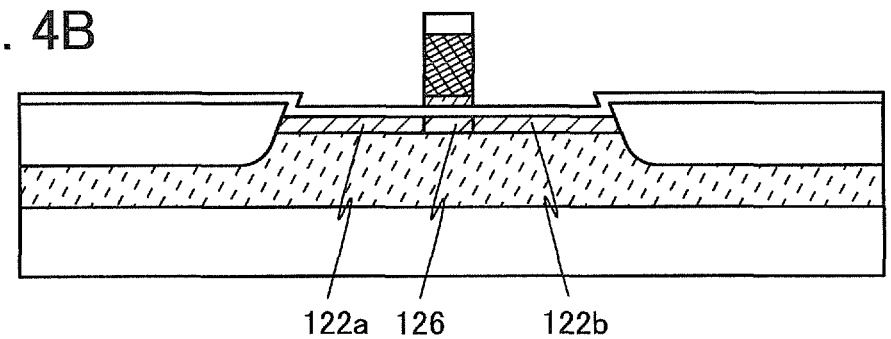

Next, a dopant is added to the oxide semiconductor film 108a, so that the regions 122a and 122b containing the dopant are formed (see FIG. 4B). The dopant is added with the use of the conductive film 116a, the conductive film 118a, and the insulating film 120a as a mask, whereby the regions 122a and 122b containing the dopant and an oxide semiconductor region to which the dopant is not added (the channel formation region 126) can be formed in a self-aligned manner.

The dopant can be added to the oxide semiconductor film 108a by an ion doping method or an ion implantation method. As the dopant to be added, at least one element selected from hydrogen, helium, neon, argon, krypton, xenon or a Group 15 element such as nitrogen, phosphorus, or arsenic is used. Here, since the conductive film 116a, the conductive film 118a, and the insulating film 120a serve as a mask, the regions 122a and 122b to which the dopant is added and the channel formation region 126 can be formed in a self-aligned manner.

Alternatively, the dopant can be added by a method other than an ion doping method, an ion implantation method, or the like. For example, the dopant can be added in the following manner: plasma is generated in an atmosphere of gas containing an element to be added and plasma treatment is performed on an object to which the dopant is added. A dry etching apparatus, a plasma CVD apparatus, a high-density plasma CVD apparatus, or the like can be used to generate the plasma.

As for the condition of doping, for example, the acceleration voltage is set to 20 kV in the case where the dopant is nitrogen. In the case where the dopant is phosphorus, the acceleration voltage is set to 40 kV. Heat treatment is preferably performed at a temperature lower than 450° C. in the case where the dose of nitrogen or phosphorus is less than or equal to $1\times10^{14}/cm^2$. Thus, the sheet resistance of the regions 122a and 122b containing the dopant can be lower than or equal to $1\times10^7$ Ω/sq. In the case where the dose is greater than or equal to $5\times10^{14}/cm^2$ and less than $5\times10^{15}/cm^2$, the heat treatment is preferably performed at a temperature higher than or equal to 450° C. and lower than or equal to 600° C.

Thus, the sheet resistance of the regions 122a and 122b containing the dopant can be lower than or equal to $1\times10^5$ Ω/sq. In the case where the dose is greater than or equal to $5\times10^{15}/cm^2$, the heat treatment is preferably performed at a temperature higher than or equal to 600° C. Thus, the sheet resistance of the regions 122a and 122b containing the dopant can be lower than or equal to $1\times10^5$ Ω/sq.

The sheet resistance of the regions 122a and 122b containing the dopant is reduced, whereby the resistance between the region containing the dopant and the conductive film 130a and the resistance between the region containing the dopant and the conductive film 130b can be reduced. Thus, the on-state current and the mobility of the transistor can be increased.

Figure 4C:
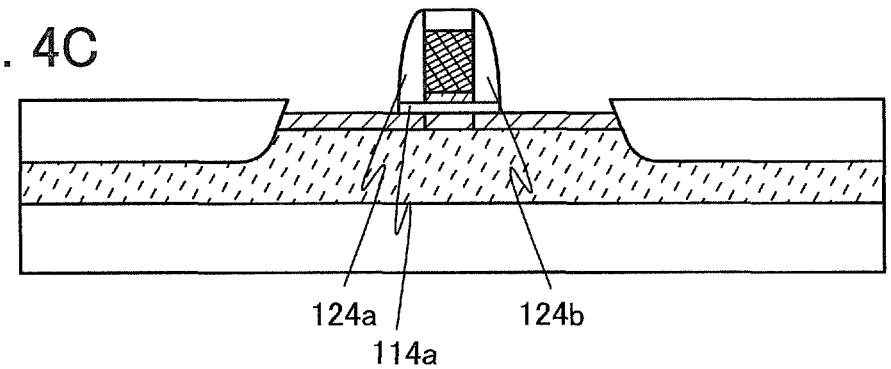

Next, the sidewall insulating films 124a and 124b are formed on side surfaces of the conductive film 116a and the conductive film 118a (see FIG. 4C). First, an insulating film is formed to cover the insulating films 112a and 112b, the oxide semiconductor film 108a, the insulating film 120a, and the like. The insulating film can be formed using a material and a film formation method similar to those for the insulating film 102. For example, a stacked-layer structure in which a silicon oxide film is formed over a silicon nitride film can be employed. In this embodiment, a silicon oxynitride film is formed by a sputtering method as the insulating film that is used to form the sidewall insulating films 124a and 124b.

Next, heat treatment may be performed. The heat treatment is performed typically at a temperature higher than or equal to 150° C. and lower than or equal to 450° C., preferably higher than or equal to 250° C. and lower than or equal to 325° C. Alternatively, the heat treatment may be performed while the temperature is gradually increased from 150° C. to 450° C. or from 250° C. to 325° C.

When the heat treatment is performed, oxygen is diffused into the oxide semiconductor film 108a from the insulating film 114 in contact with the oxide semiconductor film 108a, so that oxygen vacancies at the surface of the oxide semiconductor film 108a, which is in contact with the insulating film 114, and in the vicinity thereof can be reduced. Further, resistance of the regions 122a and 122b containing the dopant can be reduced. Note that the regions 122a and 122b containing the dopant may be in a crystalline state or in an amorphous state through the heat treatment.

After that, the insulating film is subjected to highly anisotropic etching to form the sidewall insulating films 124a and 124b. At this time, the insulating film 114 is also selectively removed and processed into the gate insulating film 114a.

Figure 4D:
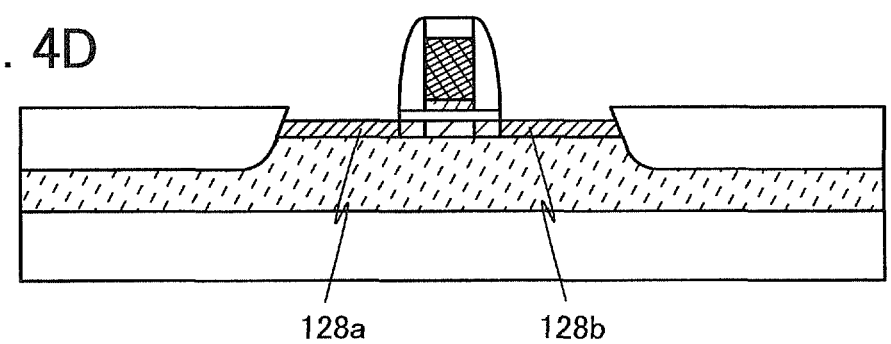

Next, the dopant is added to the oxide semiconductor film 108a, so that the regions 128a and 128b containing the dopant are formed (see FIG. 4D). The dopant is added with the use of the conductive film 116a, the conductive film 118a, the insulating film 120a, and the sidewall insulating films 124a and 124b as a mask, whereby the regions 128a and 128b containing the dopant can be formed in a self-aligned manner.

The dopant may be added to the oxide semiconductor film 108a by using the method given in the description of the formation of the regions 122a and 122b containing the dopant.

Note that the dopant is preferably added such that the concentration of the dopant in the regions 128a and 128b containing the dopant is higher than the concentration of the dopant in the regions 122a and 122b containing the dopant.

Figure 5A:
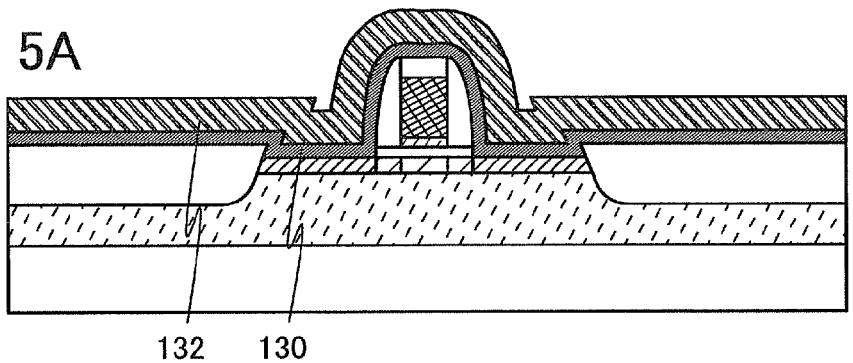
FIGS. 5A to 5D are cross-sectional views illustrating a method for manufacturing a semiconductor device according to an embodiment of the present invention.

Next, a conductive film 130 is formed to cover the insulating films 112a and 112b, the oxide semiconductor film 108a, the insulating film 120a, and the like, and a conductive film 132 is formed over the conductive film 130 (see FIG. 5A). The conductive film 130 and the conductive film 132 are later processed into a source electrode and a drain electrode. Any of metals such as aluminum, titanium, chromium, nickel, copper, yttrium, zirconium, molybdenum, silver, tantalum, and tungsten, or an alloy containing any of the metals as its main component can be used for each of the conductive film 130 and the conductive film 132. Further, like the conductive film 116 and the conductive film 118, a transparent conductive material containing indium oxide, tin oxide, or zinc oxide may be used.

Examples of combinations of the conductive film 130 and the conductive film 132 which serve as the source electrode and the drain electrode are as follows: a two-layer structure in which a titanium film is stacked over an aluminum film; a two-layer structure in which a titanium film is stacked over a tungsten film; a two-layer structure in which a copper film is stacked over a copper-magnesium-aluminum alloy film; and the like. Although the case where the source electrode and the drain electrode have a two-layer structure of the conductive film 130 and the conductive film 132 is described in this embodiment, the present invention is not limited to this embodiment. The source electrode and the drain electrode may have a single-layer structure or a stacked-layer structure of three or more layers. In the case where the source electrode and the drain electrode have a single-layer structure, a tungsten film can be used. In the case where the source electrode and the drain electrode have a three-layer structure, an aluminum film may be stacked over a titanium film, and another titanium film may be stacked over the aluminum film.

In this embodiment, the conductive film 130 is preferably thinner than the conductive film 132. For example, the thickness of the conductive film 130 is greater than or equal to 10 nm and less than or equal to 50 nm, and the thickness of the conductive film 132 is greater than or equal to 50 nm and less than or equal to 500 nm.

In this embodiment, the case where a tungsten film having a thickness of 30 nm is formed as the conductive film 130 by a sputtering method and a titanium film having a thickness of 100 nm is formed as the conductive film 132 by a sputtering method is described.

Figure 5B:
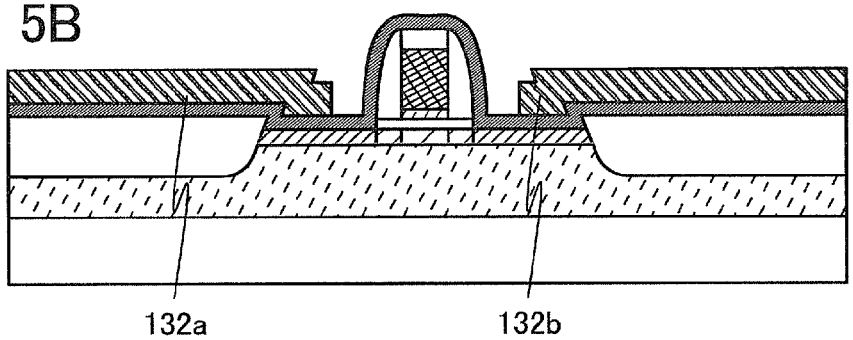

Next, a mask is formed over the conductive film 132, and the conductive film 132 is etched to form the conductive films 132a and 132b (see FIG. 5B). Wet etching or dry etching can be used in etching of the conductive film 132, or wet etching and dry etching may be used in combination. The etching conditions (e.g., an etching gas or an etchant, etching time, and temperature) are set as appropriate in accordance with the material so that the conductive film 132 can be etched into a desired shape. Note that dry etching is preferably used for finely processing the transistor. As an etching gas used for dry etching of the conductive film 132, for example, a gas containing fluorine, such as sulfur hexafluoride ($SF_6$), nitrogen trifluoride ($NF_3$), or trifluoromethane ($CHF_3$), a mixed gas of carbon tetrafluoride ($CF_4$) and hydrogen, or the like can be used. A rare gas (helium (He), argon (Ar), or xenon (Xe)), carbon monoxide, carbon dioxide, or the like may be added to the etching gas used for dry etching.

Etching in the case where tungsten is used for the conductive film 130 and titanium is used for the conductive film 132 is performed under the following conditions, for example: the ICP power is 450 W and the bias power is 100 W; the pressure is 1.9 Pa; the etching gas is a mixed gas of $BCl_3$ and $Cl_2$; and the flow rate of $BCl_3$ is 60 sccm and the flow rate of $Cl_2$ is 20 sccm. When etching is performed under such conditions, the conductive film 132 can be removed while the conductive film 130 is not removed. Further, the conductive film 132 is removed, whereby the conductive films 132a and 132b can be formed.

Figure 5C:
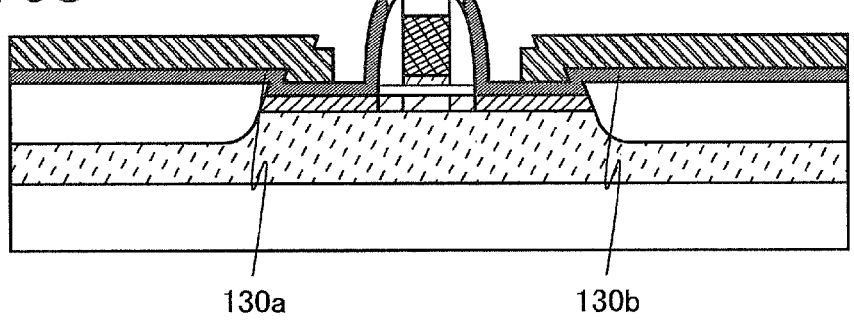

Next, a mask is formed over the conductive films 132a and 132b and the conductive film 130, and the conductive film 130 is etched to form the conductive films 130a and 130b (see FIG. 5C). Thus, the source electrode and the drain electrode can be formed. When the conductive films 130a and 130b are provided in contact with the sidewall insulating films 124a and 124b, a surface of the oxide semiconductor film 108a can be surely covered with the conductive films even when mask misalignment occurs. Further, variation in electrical characteristics of transistors due to mask misalignment can be suppressed. Furthermore, the oxide semiconductor film 108a is not exposed to an etching gas in formation of the source electrode and the drain electrode, which is preferable.

For example, etching is performed under the following conditions: the ICP power is 500 W and the bias power is 10 W; the pressure is 1.5 Pa; the etching gas is a mixed gas of $CF_4$, $Cl_2$, and $O_2$; and the flow rate of $CF_4$ is 25 sccm, the flow rate of $Cl_2$ is 25 sccm, and the flow rate of $O_2$ is 10 sccm. When etching is performed under such conditions, the conductive film 130 can be removed while the insulating film 120a and the sidewall insulating films 124a and 124b are not removed. Further, the conductive film 130 is removed, whereby the conductive films 130a and 130b can be formed. Furthermore, the conductive films 130a and 130b are in contact with the sidewall insulating films 124a and 124b, respectively. Because the insulating film 120a is provided over the conductive film 118a, the conductive films 130a and 130b can be prevented from being in contact with the conductive film 118a. Accordingly, a short circuit between the gate electrode and the source and drain electrodes can be prevented.

Figure 5D:
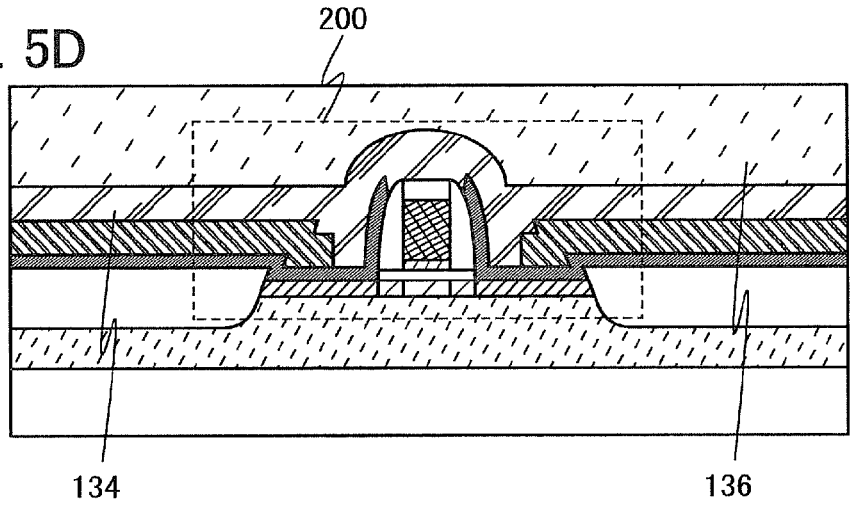

Next, the insulating film 134 is formed over the conductive films 130a and 130b, the conductive films 132a and 132b, and the insulating film 120a, and the insulating film 136 is formed over the insulating film 134 (see FIG. 5D). The insulating film 134 and the insulating film 136 can each be formed using a material containing an inorganic insulating material such as silicon oxide, silicon nitride oxide, silicon nitride, hafnium oxide, aluminum oxide, or tantalum oxide. Moreover, the insulating film 134 and the insulating film 136 can each be formed using an organic insulating material such as polyimide or acrylic. Here, a two-layer structure of the insulating film 134 and the insulating film 136 is employed; however, a structure of an insulating film which covers the transistor is not limited thereto. After the formation of the insulating film 136, a surface thereof may be planarized by CMP, etching treatment, or the like.

Through the above steps, the transistor 200 of an embodiment of the present invention can be manufactured (see FIG. 5D).

Figure 6:
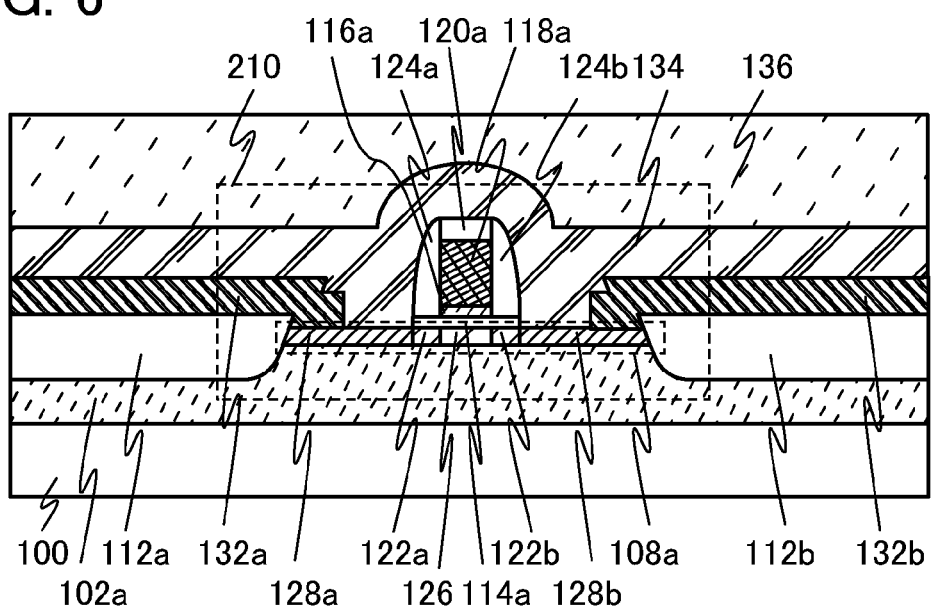
FIG. 6 is a cross-sectional view illustrating a semiconductor device according to an embodiment of the present invention.

Although the case where the source electrode and the drain electrode of the transistor 200 are a stack of the conductive film 130a and the conductive film 132a and a stack of the conductive film 130b and the conductive film 132b is described in this embodiment, the present invention is not limited to this embodiment. As in a transistor 210 illustrated in FIG. 6, the source electrode and the drain electrode may have a single-layer structure with the conductive films 132a and 132b.

In the manufacturing method according to an embodiment of the present invention, impurities including hydrogen in the oxide semiconductor film can be reduced. Accordingly, the channel formation region in the oxide semiconductor film can be made to be an i-type (intrinsic) semiconductor or a semiconductor extremely close to an i-type semiconductor. Thus, the off-state current of the transistor can be extremely small.

In the transistor according to an embodiment of the present invention, oxygen vacancies are reduced in the channel formation region of the oxide semiconductor film. Thus, generation of carriers which results from oxygen vacancies can be suppressed; therefore, shift of the threshold voltage of the transistor can be suppressed. Because the side surfaces of the oxide semiconductor film are in contact with the insulating films from which oxygen is released by application of heat, the side surfaces of the oxide semiconductor film are not in contact with the source electrode and the drain electrode, which makes it possible to prevent electric current from easily flowing along the side surfaces of the oxide semiconductor film. Thus, the off-state current of the transistor can be reduced.

Further, in the transistor according to an embodiment of the present invention, when heat treatment is performed after the oxide semiconductor film is formed over the insulating film from which oxygen is released by application of heat, oxygen can be diffused into the oxide semiconductor film from the insulating film and interface states at the interface between the insulating film and the oxide semiconductor film can be reduced. After the oxide semiconductor film is selectively etched, the insulating film from which oxygen is released by application of heat is formed in contact with the side surfaces of the etched oxide semiconductor film. Thus, the side surfaces of the etched oxide semiconductor film are not exposed to a reduced-pressure atmosphere and an etchant, whereby creation of oxygen vacancies at the side surfaces of the oxide semiconductor film can be suppressed. Furthermore, by a heating step after formation of the gate insulating film, oxygen is diffused into the oxide semiconductor film from the insulating film from which oxygen is released by application of heat; therefore, even when oxygen vacancies are created at the side surfaces of the oxide semiconductor film, the oxygen vacancies can be reduced with the diffused oxygen. As a result, the threshold voltage of the transistor can be prevented from shifting in the negative direction and the generation of leakage current between the source electrode and the drain electrode of the transistor can be suppressed.

With the structure according to an embodiment of the present invention, it is possible to provide a semiconductor device including an oxide semiconductor having electrical characteristics which are favorable and less likely to fluctuate.

Embodiment 2

In this embodiment, a method for manufacturing a transistor which is partly different from that in Embodiment 1 will be described with reference to FIGS. 7A to 7D and FIGS. 8A to 8C. Note that the difference from the method for manufacturing the transistor 200 in Embodiment 1 is a method for forming a source electrode and a drain electrode. Therefore, the detailed description of steps similar to those in Embodiment 1 is omitted.

A dopant is added to the oxide semiconductor film 108a with the use of the gate electrode and the sidewall insulating films 124a and 124b as a mask, whereby the regions 128a and 128b containing the dopant are formed. After that, the conductive film 130 and the conductive film 132 are sequentially stacked (see FIG. 7A). The manufacturing steps illustrated in FIGS. 7A to 7D in the case where a tungsten film having a thickness of 30 nm is formed as the conductive film 130 by a sputtering method and a copper film having a thickness of 100 nm is formed as the conductive film 132 by a sputtering method are described.

Figure 7A:
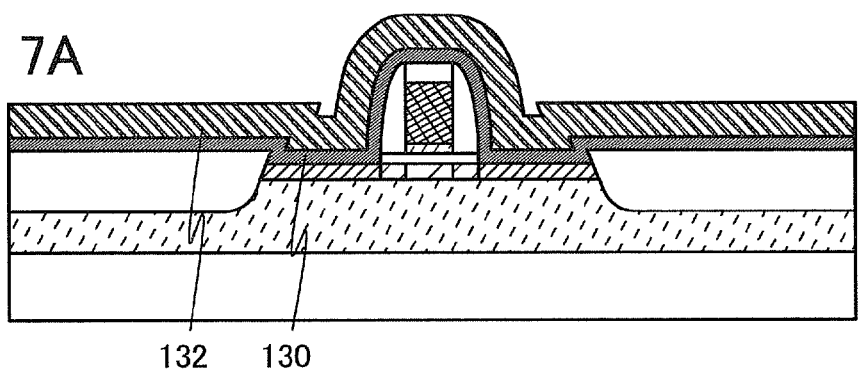
FIGS. 7A to 7D are cross-sectional views illustrating a method for manufacturing a semiconductor device according to an embodiment of the present invention.
Figure 7B:
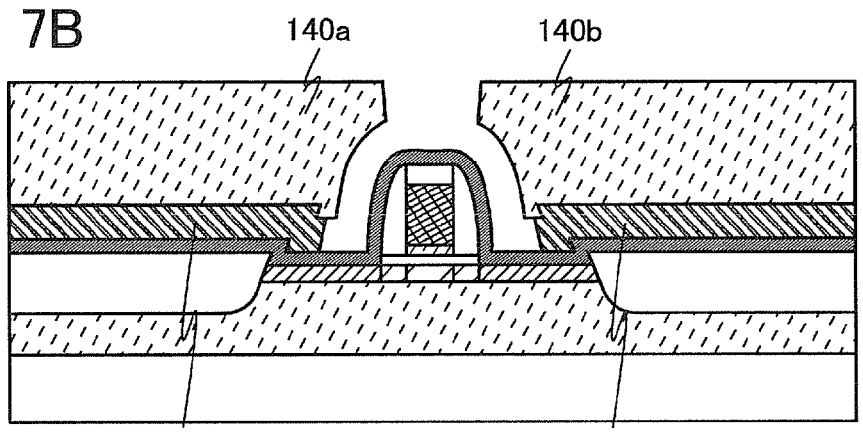

After that, masks 140a and 140b are formed over the conductive film 132 through a photolithography process, and the conductive film 132 is etched using the masks 140a and 140b to form conductive films 132c and 132d (see FIG. 7B). In this embodiment, wet etching is performed as the etching.

Figure 7C:
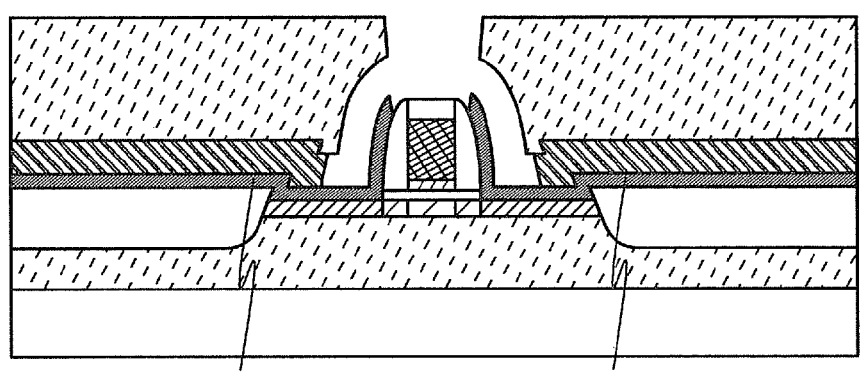

Next, the conductive film 130 is etched using the masks 140a and 140b to form conductive films 130c and 130d (see FIG. 7C). In this embodiment, dry etching is performed as the etching. The conditions described in Embodiment 1 may be employed for the dry etching. Note that the masks 140a and 140b are removed after the formation of the conductive films 130c and 130d.

Here, the dopant may further be added to the oxide semiconductor film 108a through the conductive films 130c and 130d.

Figure 7D:
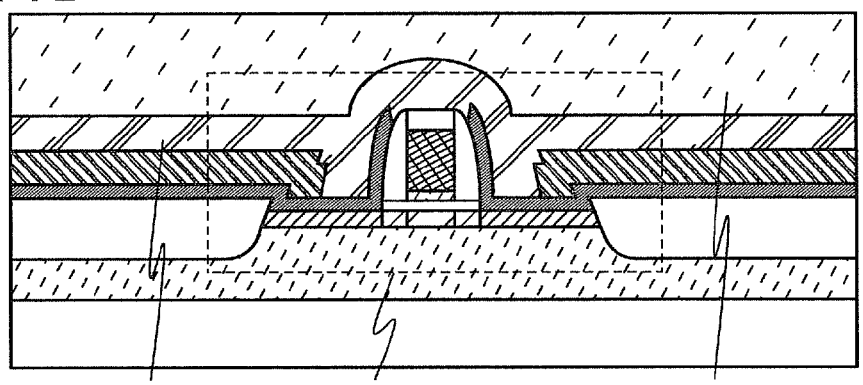

Next, the insulating film 134 is formed over the conductive films 130c and 130d, the conductive films 132c and 132d, and the insulating film 120a, and the insulating film 136 is formed over the insulating film 134 (see FIG. 7D).

Through the above steps, a transistor 220 of an embodiment of the present invention can be formed.

Next, a method for manufacturing a transistor 230 which is partly different from the method for manufacturing the transistor 220 will be described with reference to FIGS. 8A to 8C.

First, in a manner similar to FIG. 7A, a dopant is added to the oxide semiconductor film 108a with the use of the gate electrode and the sidewall insulating films 124a and 124b as a mask, whereby the regions 128a and 128b containing the dopant are formed. After that, the conductive film 130 and the conductive film 132 are sequentially stacked. The manufacturing steps illustrated in FIGS. 8A to 8C in the case where a tungsten film having a thickness of 30 nm is formed as the conductive film 130 by a sputtering method and a titanium film having a thickness of 100 nm is formed as the conductive film 132 by a sputtering method are described.

Figure 8A:
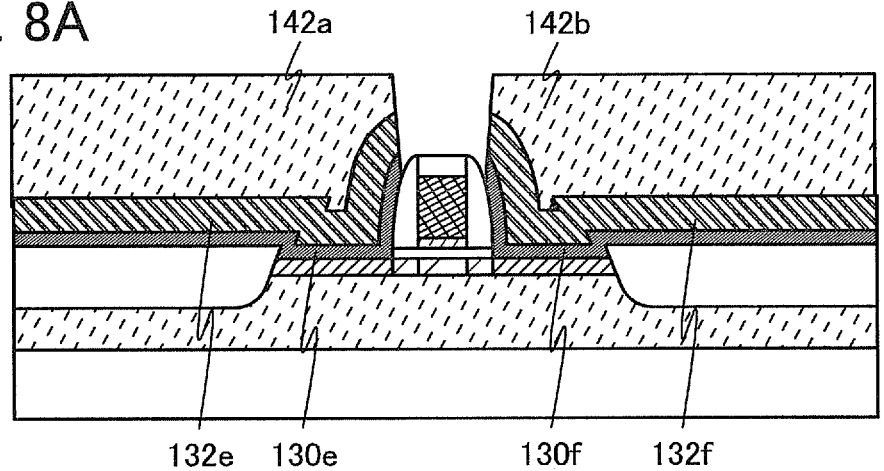
FIGS. 8A to 8C are cross-sectional views illustrating a method for manufacturing a semiconductor device according to an embodiment of the present invention.
Figure 8B:
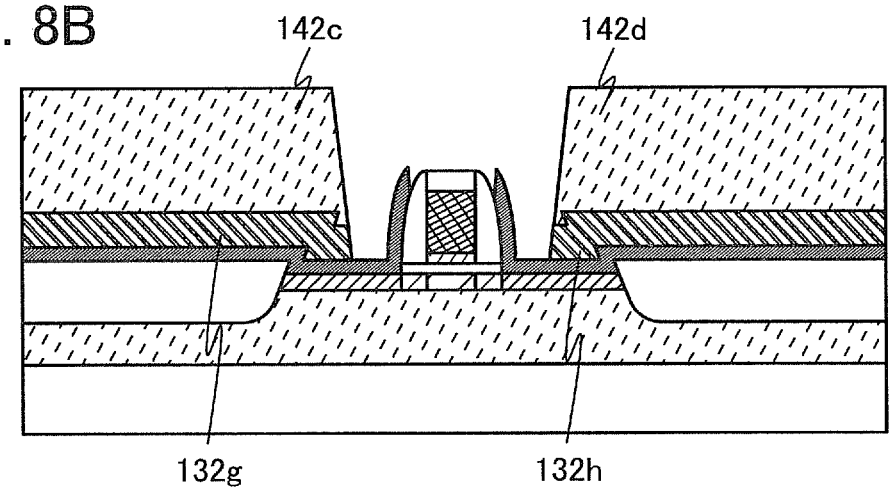

After that, masks 142a and 142b are formed over the conductive film 132 through a photolithography process, and the conductive film 132 and the conductive film 130 are etched using the masks 142a and 142b to form conductive films 132e and 132f and conductive films 130e and 130f (see FIG. 8A). In this embodiment, dry etching is performed as the etching.

Next, the masks 142a and 142b are subjected to a slimming process so that the masks 142a and 142b shrink, whereby masks 142c and 142d are formed. Accordingly, the conductive films 132e and 132f are partly exposed. The exposed portions of the conductive films 132e and 132f are etched using the masks 142c and 142d to form conductive films 132g and 132h (see FIG. 8B). The masks 142c and 142d are removed after the formation of the conductive films 132g and 132h.

Here, the dopant may further be added to the oxide semiconductor film 108a through the conductive films 132g and 132h.

Figure 8C:
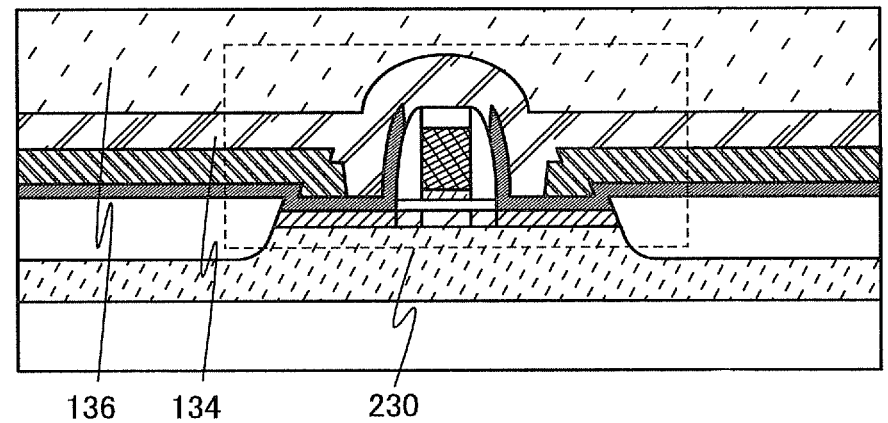

Next, the insulating film 134 is formed over the conductive films 130e and 130f, the conductive films 132g and 132h, and the insulating film 120a, and the insulating film 136 is formed over the insulating film 134 (see FIG. 8C).

Through the above steps, the transistor 230 of an embodiment of the present invention can be formed.

Embodiment 3

In this embodiment, examples of a circuit configuration and an operation of a semiconductor device including any of the transistors described in Embodiments 1 and 2 will be described with reference to FIGS. 9A and 9B, FIGS. 10A and 10B, FIGS. 11A and 11B, and FIG. 12. Note that in some circuit diagrams, "OS" is written beside a transistor in order to indicate that the transistor includes an oxide semiconductor.

<Cross-Sectional Structure of Semiconductor Device>

First, an example of a cross-sectional structure of a semiconductor device will be described with reference to FIG. 9A. The semiconductor device illustrated in FIG. 9A includes a transistor 320 including a first semiconductor material in a lower portion and a capacitor 252 and a transistor 250 including a second semiconductor material in an upper portion. The semiconductor device in FIG. 9A functions as a memory cell.

Here, the first semiconductor material used for the transistor 320 and the second semiconductor material used for the transistor 250 are preferably different semiconductor materials. For example, the first semiconductor material is preferably a semiconductor material other than an oxide semiconductor (such as silicon). The second semiconductor material is preferably an oxide semiconductor material. The transistor 320 including the semiconductor material other than an oxide semiconductor can easily operate at high speed. The transistor 250 including the oxide semiconductor can hold charge for a long time owing to extremely low off-state current.

Figure 9A:
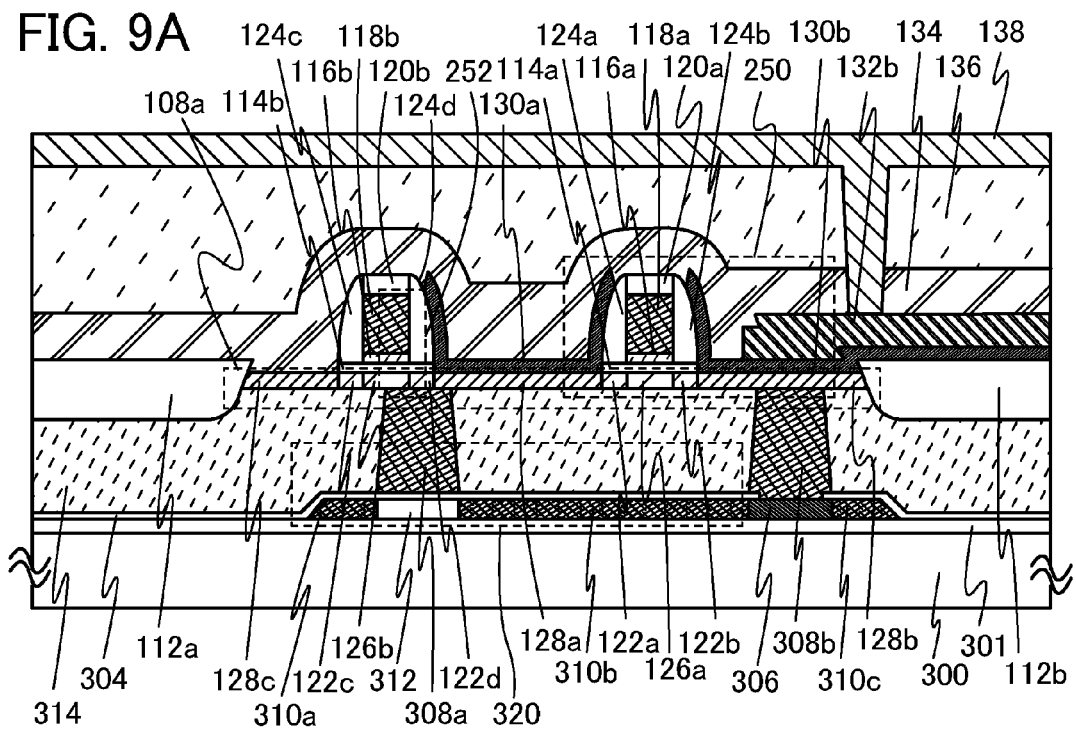
FIGS. 9A and 9B are a cross-sectional view and a circuit diagram illustrating a semiconductor device according to an embodiment of the present invention.

The transistor 320 in FIG. 9A includes a channel formation region 312 including a semiconductor material (such as silicon) over a substrate 300 with an insulating film 301 which functions as a base interposed therebetween, an impurity region 310a and an impurity region 310b between which the channel formation region 312 is sandwiched, a gate insulating film 304 over the channel formation region 312, and a gate electrode 308a over the gate insulating film 304.

Note that a source electrode and a drain electrode are not illustrated in FIG. 9A; an element in such a state is also referred to as a transistor for the sake of convenience. Further, in such a case, in description of a connection of a transistor, a source region and a source electrode may be collectively referred to as a source electrode, and a drain region and a drain electrode may be collectively referred to as a drain electrode. That is, in this specification and the like, the term "source electrode" may include a source region. The impurity region 310a functions as one of a source electrode and a drain electrode of the transistor 320. The impurity region 310b functions as the other of the source electrode and the drain electrode of the transistor 320.

An insulating film 314 is provided in contact with the transistor 320 and an electrode 308b. In addition, the insulating film 314 is provided such that upper surfaces of the gate electrode 308a of the transistor 320 and the electrode 308b are exposed.

Note that for higher integration, it is preferable that, as in FIG. 9A, the transistor 320 does not have a sidewall insulating film. On the other hand, in the case where characteristics of the transistor 320 have priority, a sidewall insulating film may be provided on a side surface of the gate electrode 308a, and the impurity regions 310a and 310b may each include a region having a different impurity concentration in a region overlapping with the sidewall insulating film.

In FIG. 9A, the transistor 250 is provided over the insulating film 314, the gate electrode 308a, and the electrode 308b. The insulating film 314 is preferably an insulating film from which oxygen is released by application of heat.

A transistor according to an embodiment of the present invention is used as the transistor 250 in FIG. 9A. The transistor 250 includes a channel formation region 126a, a gate insulating film 114a, a gate electrode formed with a conductive film 116a and a conductive film 118a, an insulating film 120a, sidewall insulating films 124a and 124b, regions 122a, 122b, 128a, and 128b containing a dopant, conductive films 130a and 130b, and a conductive film 132b.

The capacitor 252 in FIG. 9A includes the gate electrode 308a, a region 126b of an oxide semiconductor film to which the dopant is not added, an insulating film 114b, and an electrode formed with a conductive film 116b and a conductive film 118b. In other words, the electrode functions as one electrode of the capacitor 252, and the gate electrode 308a functions as the other electrode of the capacitor 252.

The gate electrode of the transistor 250 and the electrode of the capacitor 252 in FIG. 9A are formed through the same process; therefore, the electrode of the capacitor 252 is also provided with sidewall insulating films 124c and 124d and an insulating film 120b. In addition, regions 122c and 122d containing the dopant are formed through the same process as the regions 122a and 122b containing the dopant, and a region 128c containing the dopant is formed through the same process as the regions 128a and 128b containing the dopant.

In the semiconductor device illustrated in FIG. 9A, insulating films 112a and 112b capable of preventing oxygen from being released from side surfaces of the oxide semiconductor film 108a are provided on the side surfaces of the oxide semiconductor film.

In addition, an insulating film 134 is provided to cover the transistor 250 and the capacitor 252, and an insulating film 136 is provided over the insulating film 134. The conductive film 132b is connected to a wiring 138 through an opening formed in the insulating film 134 and the insulating film 136.

In FIG. 9A, the impurity region 310b is connected to the conductive film 130b through an impurity region 306, an opening formed in the gate insulating film 304, the electrode 308b, and the region 128b containing the dopant in the oxide semiconductor film. In other words, the other of the source electrode and the drain electrode of the transistor 320 is electrically connected to one of a source electrode and a drain electrode of the transistor 250.

Note that an embodiment of the present invention is not limited to the structure. Electrical connections of the memory cell, the transistors, and the capacitor can be changed as appropriate. For example, the impurity region 310b may be electrically connected to an impurity region 310a in another memory cell through the impurity region 306 and an impurity region 310c. In that case, an opening does not necessarily need to be formed in the gate insulating film 304. Further, the electrode 308b does not necessarily need to be formed. In other words, in the case where the other of the source electrode and the drain electrode of the transistor 320 is electrically connected to one of a source electrode and a drain electrode of a transistor 320 in another memory cell, the other of the source electrode and the drain electrode of the transistor 320 does not necessarily need to be electrically connected to the one of the source electrode and the drain electrode of the transistor 250.

With the electrode 308b, dishing caused in CMP treatment on the insulating film 314 can be prevented and the top surfaces of the insulating film 314, the gate electrode 308a, and the electrode 308b can be planarized more. This is preferable because it is possible to planarize a surface where the oxide semiconductor film is formed.

Although both of the above transistors are n-channel transistors, it is needless to say that p-channel transistors can be used. The technical nature of the disclosed invention is to use a semiconductor material with which off-state current can be sufficiently decreased, such as an oxide semiconductor, in the transistor 250 so that data can be held. Therefore, it is not necessary to limit a specific structure of the semiconductor device, such as a material of the semiconductor device or a structure of the semiconductor device, to the structure described here.

<Basic Circuit>

Next, a basic circuit configuration of the semiconductor device illustrated in FIG. 9A and an operation thereof will be described with reference to FIG. 9B. In a semiconductor device illustrated in FIG. 9B, a first wiring (1st Line) is electrically connected to the source electrode or the drain electrode of the transistor 320. A second wiring (2nd Line) is electrically connected to the drain electrode or the source electrode of the transistor 320. A third wiring (3rd Line) is electrically connected to the source electrode or the drain electrode of the transistor 250. A fourth wiring (4th Line) is electrically connected to the gate electrode of the transistor 250. The gate electrode of the transistor 320 and the drain electrode or the source electrode of the transistor 250 are electrically connected to one electrode of the capacitor 252. A fifth wiring (5th Line) is electrically connected to the other electrode of the capacitor 252. Note that the first wiring (1st Line) may be electrically connected to the third wiring (3rd Line). Note that a portion where the gate electrode of the transistor 320, the source electrode or the drain electrode of the transistor 250, and the one electrode of the capacitor 252 are connected to each other is referred to as a node FG.

Here, a transistor according to an embodiment of the present invention is used as the transistor 250. The transistor according to an embodiment of the present invention has a characteristic of a significantly small off-state current. For that reason, a potential of the gate electrode of the transistor 320 can be held for an extremely long period by turning off the transistor 250. By providing the capacitor 252, holding of charge applied to the gate electrode of the transistor 320 and reading of data held can be performed more easily.

Note that there is no particular limitation on the first semiconductor material used for the transistor 320. In terms of increasing the speed of reading data, it is preferable to use a transistor with high switching speed such as a transistor formed using single crystal silicon, for example.

The semiconductor device in FIG. 9B utilizes a characteristic in which the potential of the gate electrode of the transistor 320 can be held, and thus enables data writing, holding, and reading as follows.

First of all, writing and holding of data will be described. First, the potential of the fourth wiring is set to a potential at which the transistor 250 is turned on, so that the transistor 250 is turned on. Accordingly, the potential of the third wiring is supplied to the gate electrode of the transistor 320 and to the capacitor 252. That is, predetermined charge is supplied to the gate electrode of the transistor 320 (writing). Here, one of two kinds of charges providing different potentials (hereinafter a charge providing a low potential $V_L$ is referred to as charge $Q_L$ and a charge providing a high potential $V_H$ is referred to as charge $Q_H$) is applied. Note that three or more kinds of charges providing different potentials may be applied to improve storage capacity. After that, the potential of the fourth wiring is set to a potential at which the transistor 250 is turned off, so that the transistor 250 is turned off. Thus, the charge supplied to the gate electrode of the transistor 320 is held (holding).

Since the off-state current of the transistor 250 is significantly small, the charge of the gate electrode of the transistor 320 is held for a long time.

Next, reading of data will be described. By supplying an appropriate potential (a reading potential) to the fifth wiring while supplying a predetermined potential (a constant potential) to the first wiring, the potential of the second wiring varies depending on the amount of charge held at the gate electrode of the transistor 320. This is because in general, when the transistor 320 is an n-channel transistor, an apparent threshold voltage $V_{th\_H}$ in the case where $Q_H$ is given to the gate electrode of the transistor 320 is lower than an apparent threshold voltage $V_{th\_L}$ in the case where $Q_L$ is given to the gate electrode of the transistor 320. Here, an apparent threshold voltage refers to the potential of the fifth wiring which is needed to turn on the transistor 320. Thus, the potential of the fifth wiring is set to a potential $V_0$ which is intermediate between $V_{th\_H}$ and $V_{th\_L}$ (e.g., $V_0$=ground potential GND), whereby charge supplied to the gate electrode of the transistor 320 can be determined. For example, in the case where $Q_H$ is supplied in writing, when the potential of the fifth wiring is $V_0$ ($>V_{th\_H}$), the transistor 320 is turned on. In the case where $Q_L$ is supplied in writing, even when the potential of the fifth wiring is $V_0$ ($<V_{th\_L}$), the transistor 320 remains off. Therefore, the data held can be read by measuring the potential of the second wiring.

Note that in the case where memory cells are arrayed, it is necessary that data of only a desired memory cell can be read. In the case where data of a predetermined memory cell are read and data of the other memory cells are not read, fifth wirings in memory cells that are not a target for reading are supplied with a potential at which the transistors 320 are turned off regardless of the state of the gate electrodes, that is, a potential lower than $V_{th\_H}$ (e.g., $V_1$).

Next, rewriting of data will be described. Rewriting of data is performed in a manner similar to that of the writing and holding of data. That is, the potential of the fourth wiring is set to a potential at which the transistor 250 is turned on, so that the transistor 250 is turned on. Accordingly, the potential of the third wiring (a potential for new data) is supplied to the gate electrode of the transistor 320 and to the capacitor 252. After that, the potential of the fourth wiring is set to a potential at which the transistor 250 is turned off, so that the transistor 250 is turned off. Accordingly, the gate electrode of the transistor 320 is supplied with charge for new data.

In the semiconductor device according to this embodiment, data can be directly rewritten by another data writing operation as described above. Therefore, extraction of charge from a floating gate with the use of a high voltage which is necessary for a flash memory or the like is not needed, and thus a decrease in operation speed due to erasing operation can be suppressed. In other words, high-speed operation of the semiconductor device can be achieved.

Note that the drain electrode (or the source electrode) of the transistor 250 is electrically connected to the gate electrode of the transistor 320 and therefore has a function similar to that of a floating gate of a floating gate transistor used for a nonvolatile memory element. Therefore, when the transistor 250 is turned off, the node FG can be regarded as being embedded in an insulator and thus charge is held at the node FG. The off-state current of the transistor 250 including an oxide semiconductor is smaller than or equal to $1/100000$ of the off-state current of a transistor including silicon or the like; thus, loss of the charge accumulated in the node FG due to leakage in the transistor 250 is negligible. That is, with the transistor 250 including an oxide semiconductor, a nonvolatile memory device which can hold data without being supplied with power can be realized.

For example, when the off-state current of the transistor 250 at room temperature (25° C.) is 10 zA (1 zA (zeptoampere) is $1\times10^{-21}$ A) or less and the capacitance of the capacitor 252 is approximately 10 fF, data can be held for $10^4$ seconds or longer. It is needless to say that the holding time depends on transistor characteristics and capacitance.

Further, the semiconductor device according to this embodiment does not have the problem of deterioration of a gate insulating film (a tunnel insulating film), which is a problem of a conventional floating gate transistor. That is, the problem of deterioration of a gate insulating film due to injection of electrons into a floating gate, which is a conventional problem, can be solved. This means that there is no limit on the number of write cycles in principle. Furthermore, a high voltage needed for writing or erasing in a conventional floating gate transistor is not necessary.

In the semiconductor device according to this embodiment, the node FG has a function similar to that of a floating gate of a floating gate transistor of a flash memory or the like, but the node FG of this embodiment has a feature which is essentially different from that of the floating gate of the flash memory or the like.

In the case of a flash memory, since a high potential is applied to a control gate, it is necessary to keep a proper distance between cells in order to prevent the potential of the control gate from affecting a floating gate of an adjacent cell. This is one factor inhibiting higher integration of the semiconductor device. The factor is attributed to a basic operational principle of a flash memory, in which a tunneling current is generated by applying a high electric field.

On the other hand, the semiconductor device according to this embodiment is operated by switching of a transistor including an oxide semiconductor and does not use the above-described principle of charge injection by a tunneling current. That is, a high electric field for charge injection is not necessary, unlike a flash memory. Accordingly, it is not necessary to consider an influence of a high electric field from a control gate on an adjacent cell, and this facilitates an increase in the degree of integration.

In addition, the semiconductor device according to this embodiment is advantageous over a flash memory also in that a high electric field is not necessary and a large peripheral circuit (such as a step-up circuit) is not necessary. For example, the highest voltage applied to the memory cell according to this embodiment (the difference between the highest potential and the lowest potential applied to respective terminals of the memory cell at the same time) can be 5 V or less, preferably 3 V or less, in each memory cell in the case where data of two stages (one bit) is written.

Note that in addition to the increase in the degree of integration, a multilevel technique can be employed to increase the storage capacity of the semiconductor device. For example, three or more levels of data are written to one memory cell, whereby the storage capacity can be increased as compared to the case where two-level (one-bit) data is written. The multilevel technique can be achieved by, for example, supplying charge Q providing a potential to the gate electrode of the transistor 320, in addition to charge $Q_L$ providing a low potential and charge $Q_H$ providing a high potential as described above. In this case, enough storage capacity can be ensured even in a circuit structure with a relatively large scale (e.g., 15 $F^2$ to 50 $F^2$; F is the minimum feature size).

Figure 9B:
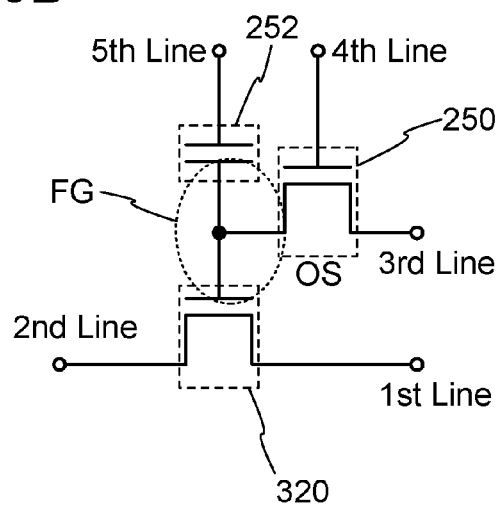

Next, memory cell arrays to which the memory cell illustrated in FIGS. 9A and 9B is applied will be described with reference to FIGS. 10A and 10B.

Figure 10A:
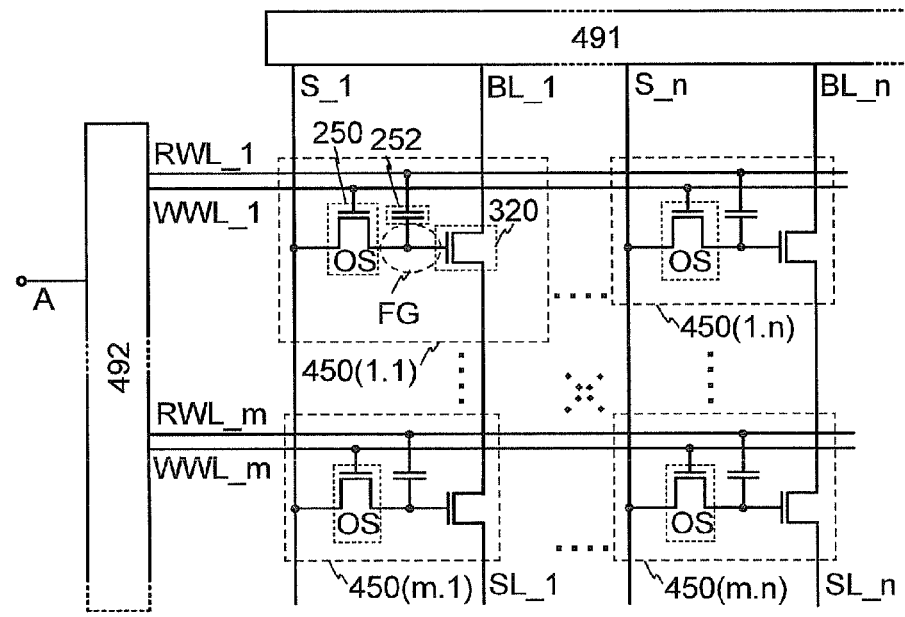
FIGS. 10A and 10B are circuit diagrams each illustrating a semiconductor device according to an embodiment of the present invention.
Figure 10B:
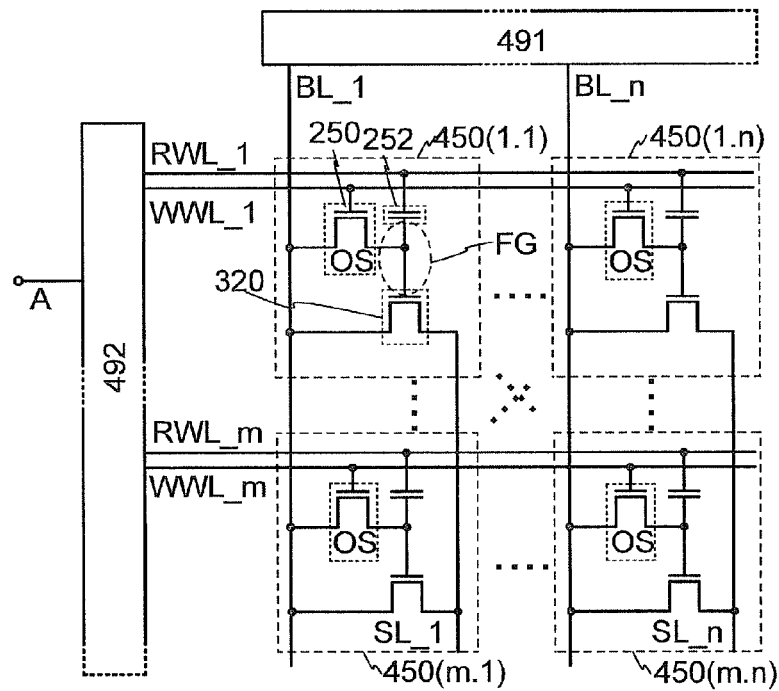

FIGS. 10A and 10B are each an example of a circuit diagram of a semiconductor device including (m×n) memory cells 450. The configuration of the memory cells 450 in FIGS. 10A and 10B is similar to that in FIGS. 9A and 9B.

In FIG. 10A, a source line SL corresponds to the first wiring in FIG. 9B; a bit line BL corresponds to the second wiring in FIG. 9B; a signal line S corresponds to the third wiring in FIG. 9B; a write word line WWL corresponds to the fourth wiring in FIG. 9B; and a read word line RWL corresponds to the fifth wiring in FIG. 9B.

The semiconductor device in FIG. 10A includes m (m is an integer greater than or equal to 2) write word lines WWL, m read word lines RWL, n (n is an integer greater than or equal to 2) bit lines BL, n source lines SL, n signal lines S, a memory cell array having the memory cells 450 arranged in a matrix of m (rows) (in the vertical direction)×n (columns) (in the horizontal direction), a first driver circuit 491 connected to the n bit lines BL and the n signal lines S, and a second driver circuit 492 connected to the m write word lines WWL and the m read word lines RWL. Note that the memory cell array in FIG. 10A is a NAND memory cell array in which the memory cells 450 are connected in series.

In the semiconductor device in FIG. 10A, writing operation and reading operation are performed for each row. The writing operation is performed as follows. A potential at which the transistor 250 is turned on is supplied to the write word line WWL of a row where writing is to be performed, so that the transistor 250 of the row where writing is to be performed is turned on. Accordingly, a potential of the signal line S is supplied to the gate electrode of the transistor 320 of the specified row, so that predetermined charge is applied to the gate electrode. Thus, data can be written to the memory cell of the specified row.

Further, the reading operation is performed as follows. First, a potential at which the transistor 320 is turned on regardless of charge of the gate electrode thereof is supplied to the read word lines RWL of the rows other than the row where reading is to be performed, so that the transistors 320 of the rows other than the row where reading is to be performed are turned on. Then, a potential (reading potential) at which an on state or an off state of the transistor 320 is determined depending on charge of the gate electrode of the transistor 320 is supplied to the read word line RWL of the row where reading is to be performed. After that, a constant potential is supplied to the source line SL so that a reading circuit (not illustrated) connected to the bit line BL is operated. Here, the plurality of transistors 320 between the source line SL and the bit line BL are turned on except the transistor 320 of the row where reading is to be performed; therefore, conductance between the source line SL and the bit line BL is determined by the state of the transistor 320 (whether being turned on or off) of the row where reading is to be performed. Since the conductance of the transistor varies depending on the electric charge in the gate electrode of the transistor 320 of the row where reading is to be performed, a potential of the bit line BL also varies accordingly. By reading the potential of the bit line BL with the reading circuit, data can be read from the memory cell of the specified row.

In FIG. 10B, a source line SL corresponds to the first wiring in FIG. 9B; a bit line BL corresponds to the second wiring and the third wiring in FIG. 9B; a write word line WWL corresponds to the fourth wiring in FIG. 9B; and a read word line RWL corresponds to the fifth wiring in FIG. 9B.

The semiconductor device in FIG. 10B includes m (m is an integer greater than or equal to 2) write word lines WWL, m read word lines RWL, n (n is an integer greater than or equal to 2) bit lines BL, n source lines SL, a memory cell array having the memory cells 450 arranged in a matrix of m (rows) (in the vertical direction)×n (columns) (in the horizontal direction), a first driver circuit 491 connected to the n bit lines BL, and a second driver circuit 492 connected to the m write word lines WWL and the m read word lines RWL. Note that the memory cell array in FIG. 10B is a NOR memory cell array in which the memory cells 450 are connected in parallel.

In addition, in each of FIGS. 10A and 10B, an address selection signal line A is connected to the second driver circuit 492. The address selection signal line A is a line which transmits a signal for selecting a row address of a memory cell.

In the semiconductor device in FIG. 10B, writing operation and reading operation are performed for each row. The writing operation is performed in a manner similar to that of the semiconductor device in FIG. 10A.

The reading operation is performed as follows. First, a potential at which the transistor 320 is turned off regardless of charge of the gate electrode thereof is supplied to the read word lines RWL of the rows other than the row where reading is to be performed, so that the transistors 320 of the rows other than the row where reading is to be performed are turned off. Then, a potential (reading potential) at which an on state or an off state of the transistor 320 is determined depending on charge of the gate electrode of the transistor 320 is supplied to the read word line RWL of the row where reading is to be performed. After that, a constant potential is supplied to the source line SL so that a reading circuit (not illustrated) connected to the bit line BL is operated. Here, conductance between the source line SL and the bit line BL is determined by the state of the transistor 320 (whether being turned on or off) of the row where reading is to be performed. That is, a potential of the bit line BL depends on charge of the gate electrode of the transistor 320 of the row where reading is to be performed. By reading the potential of the bit line BL with the reading circuit, data can be read from the memory cell of the specified row.

In the semiconductor device according to an embodiment of the present invention, a source electrode or a drain electrode of a transistor in which an oxide semiconductor is used for a channel formation region is connected to a gate electrode of a transistor in which single crystal silicon is used for a channel formation region. The off-state current of the transistor in which an oxide semiconductor is used for the channel formation region is equal to or smaller than $1/100000$ of the off-state current of the transistor in which single crystal silicon is used for the channel formation region. Accordingly, the loss of charge accumulated in the node FG can be significantly reduced. Therefore, the semiconductor devices illustrated in FIGS. 10A and 10B can hold stored data for a long time even when not supplied with power, and a memory device which does not have the limitation on the number of times data can be rewritten can be obtained.

<Cross-Sectional Structure of Semiconductor Device>

Next, an example of a semiconductor device having a structure corresponding to that of a so-called dynamic random access memory (DRAM) will be described with reference to FIG. 11A. The semiconductor device in FIG. 11A includes a transistor 260 and a capacitor 262.

Figure 11A:
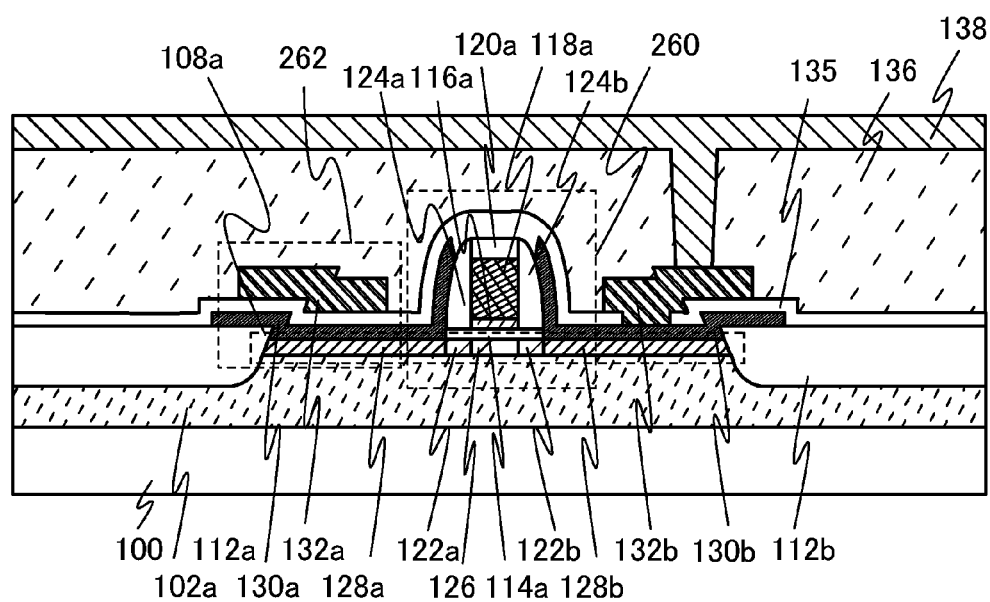
FIGS. 11A and 11B are a cross-sectional view and a circuit diagram illustrating a semiconductor device according to an embodiment of the present invention.

A transistor according to an embodiment of the present invention is used as the transistor 260 in FIG. 11A. The transistor 260 includes a channel formation region 126 in an oxide semiconductor film over a substrate 100 with an insulating film 102a interposed therebetween, a gate electrode formed with a conductive film 116a and a conductive film 118a, regions 122a and 122b containing a dopant, regions 128a and 128b containing the dopant, conductive films 130a and 130b, sidewall insulating films 124a and 124b, a gate insulating film 114a, and an insulating film 120a.

In the semiconductor device illustrated in FIG. 11A, insulating films 112a and 112b capable of preventing oxygen from being released from side surfaces of an oxide semiconductor film 108a are provided on the side surfaces of the oxide semiconductor film. In this embodiment, aluminum oxide films are used.

The capacitor 262 in FIG. 11A includes the conductive film 130a, an insulating film 135, and a conductive film 132a. In other words, the conductive film 130a functions as one electrode of the capacitor 262, and the conductive film 132a functions as the other electrode of the capacitor 262.

An insulating film 136 is provided to cover the transistor 260 and the capacitor 262. The region 128b containing the dopant is connected to a wiring 138 through the conductive film 130b, an opening formed in the insulating film 135, and a conductive film 132b. Although the conductive film 130b is connected to the wiring 138 through the conductive film 132b in FIG. 11A, the disclosed invention is not limited thereto. For example, the wiring 138 may be in direct contact with the conductive film 130b.

<Basic Circuit>

Figure 11B:
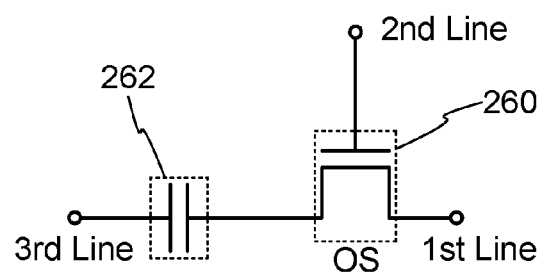

Next, a basic circuit configuration of the semiconductor device illustrated in FIG. 11A and an operation thereof will be described with reference to FIG. 11B. In a semiconductor device illustrated in FIG. 11B, a first wiring (1st Line) is electrically connected to a source electrode or a drain electrode of the transistor 260. A second wiring (2nd Line) is electrically connected to a gate electrode of the transistor 260. One electrode of the capacitor 262 is electrically connected to the drain electrode or the source electrode of the transistor 260. A third wiring (3rd Line) is electrically connected to the other electrode of the capacitor 262.

Here, the above transistor including an oxide semiconductor is used as the transistor 260, for example. A transistor including an oxide semiconductor has a characteristic of a significantly small off-state current. Therefore, when the transistor 260 is turned off, a potential supplied to the capacitor 262 can be held for an extremely long time.

The semiconductor device in FIG. 11B utilizes a characteristic in which the potential supplied to the capacitor 262 can be held, and thus enables data writing, holding, and reading as follows.

First of all, writing and holding of data will be described. For simplicity, the potential of the third wiring is fixed here. First, the potential of the second wiring is set to a potential at which the transistor 260 is turned on, so that the transistor 260 is turned on. Accordingly, the potential of the first wiring is supplied to the one electrode of the capacitor 262. That is, predetermined charge is supplied to the capacitor 262 (writing). After that, the potential of the second wiring is set to a potential at which the transistor 260 is turned off, so that the transistor 260 is turned off. Thus, the charge supplied to the capacitor 262 is held (holding). Since the off-state current of the transistor 260 is significantly small as described above, the charge can be held for a long time.

Next, reading of data will be described. By setting the potential of the second wiring to a potential at which the transistor 260 is turned on while supplying a predetermined potential (a fixed potential) to the first wiring, the potential of the first wiring varies depending on the amount of charge held in the capacitor 262. Therefore, the data held can be read by measuring the potential of the first wiring.

Next, rewriting of data will be described. Rewriting of data is performed in a manner similar to that of the writing and holding of data. That is, the potential of the second wiring is set to a potential at which the transistor 260 is turned on, so that the transistor 260 is turned on. Accordingly, the potential of the first wiring (a potential for new data) is supplied to the one electrode of the capacitor 262. After that, the potential of the second wiring is set to a potential at which the transistor 260 is turned off, so that the transistor 260 is turned off. Accordingly, the capacitor 262 is supplied with charge for new data.

In the semiconductor device according to an embodiment of the present invention, data can be directly rewritten by another data writing operation as described above. Therefore, high-speed operation of the semiconductor device can be achieved.

Note that an n-type transistor (n-channel transistor) in which electrons are majority carriers is used in the above description; it is needless to say that a p-type transistor (p-channel transistor) in which holes are majority carriers can be used instead of the n-type transistor.

Figure 12:
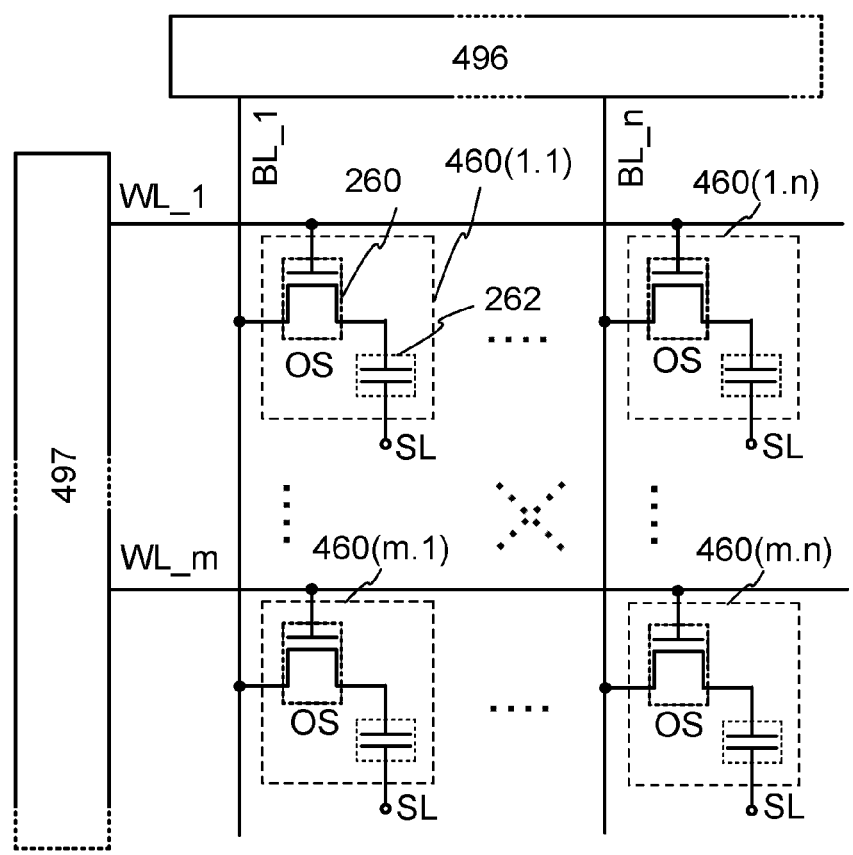
FIG. 12 is a circuit diagram illustrating a semiconductor device according to an embodiment of the present invention.

FIG. 12 illustrates an example of a circuit diagram of a semiconductor device including (m×n) memory cells 460. The configuration of the memory cells 460 in FIG. 12 is similar to that of the memory cell in FIGS. 11A and 11B. In other words, the first wiring in FIG. 11B corresponds to a bit line BL in FIG. 12; the second wiring in FIG. 11B corresponds to a word line WL in FIG. 12; and the third wiring in FIG. 11B corresponds to a source line SL in FIG. 12 (see FIG. 12).

The semiconductor device illustrated in FIG. 12 includes n bit lines BL, m word lines WL, a memory cell array having the memory cells 460 arranged in a matrix of m (rows) (in the vertical direction)×n (columns) (in the horizontal direction), a first driver circuit 496 connected to the n bit lines BL, and a second driver circuit 497 connected to the m word lines WL.

The memory cells 460 each include the transistor 260 and the capacitor 262. A gate electrode of the transistor 260 is connected to one of the word lines WL. One of a source electrode and a drain electrode of the transistor 260 is connected to one of the bit lines BL. The other of the source electrode and the drain electrode of the transistor 260 is connected to one electrode of the capacitor 262. The other electrode of the capacitor 262 is connected to a source line SL and supplied with a predetermined potential. The transistor described in any of the above embodiments is used as the transistor 260.

The semiconductor device according to an embodiment of the present invention includes a transistor in which an oxide semiconductor is used for a channel formation region, so that the off-state current of the transistor is smaller than that of a transistor in which single crystal silicon is used for a channel formation region. Accordingly, when the transistor is applied to the semiconductor device illustrated in FIG. 12, which is regarded as a so-called DRAM, a memory having an extremely long interval between refresh periods can be obtained.

The configurations, methods, and the like described in this embodiment can be combined as appropriate with any of the configurations, methods, and the like described in the other embodiments.

Embodiment 4

In this embodiment, electronic devices to which the semiconductor device described in any of the above embodiments is applied will be described with reference to FIGS. 13 to 15.

Figure 13:
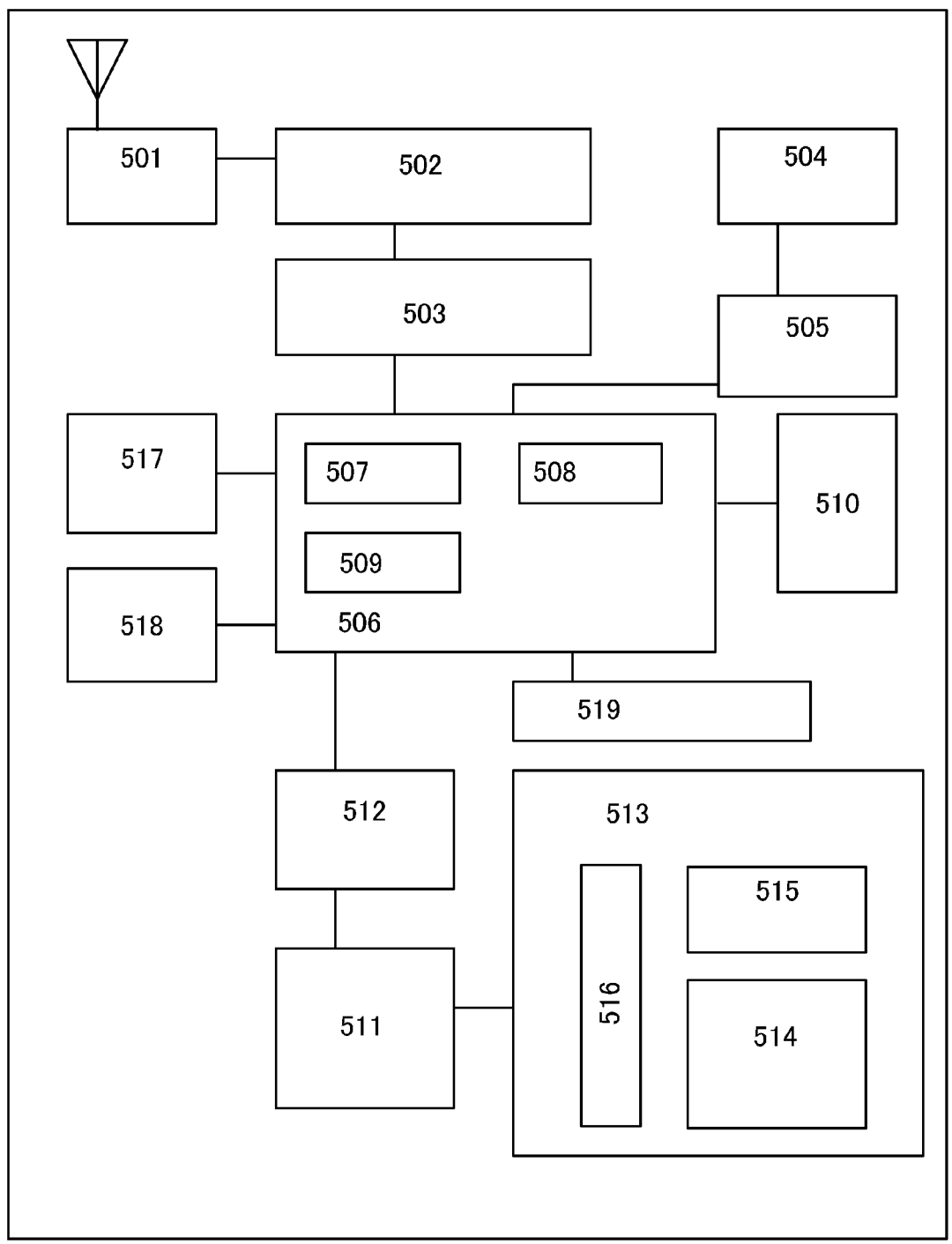
FIG. 13 is a block diagram of an electronic device according to an embodiment of the present invention.

FIG. 13 is a block diagram of a portable device. The portable device illustrated in FIG. 13 includes an RF circuit 501, an analog baseband circuit 502, a digital baseband circuit 503, a battery 504, a power supply circuit 505, an application processor 506, a flash memory 510, a display controller 511, a memory circuit 512, a display 513, a touch sensor 519, an audio circuit 517, a keyboard 518, and the like. The display 513 includes a display portion 514, a source driver 515, and a gate driver 516. The application processor 506 includes a CPU 507, a DSP 508, and an interface 509 ("IF" is an abbreviation for an interface). In general, the memory circuit 512 includes an SRAM or a DRAM. By employing the semiconductor device described in any of the above embodiments for that portion, data can be written and read at high speed and can be held for a long time, and power consumption can be sufficiently reduced.

Figure 14:
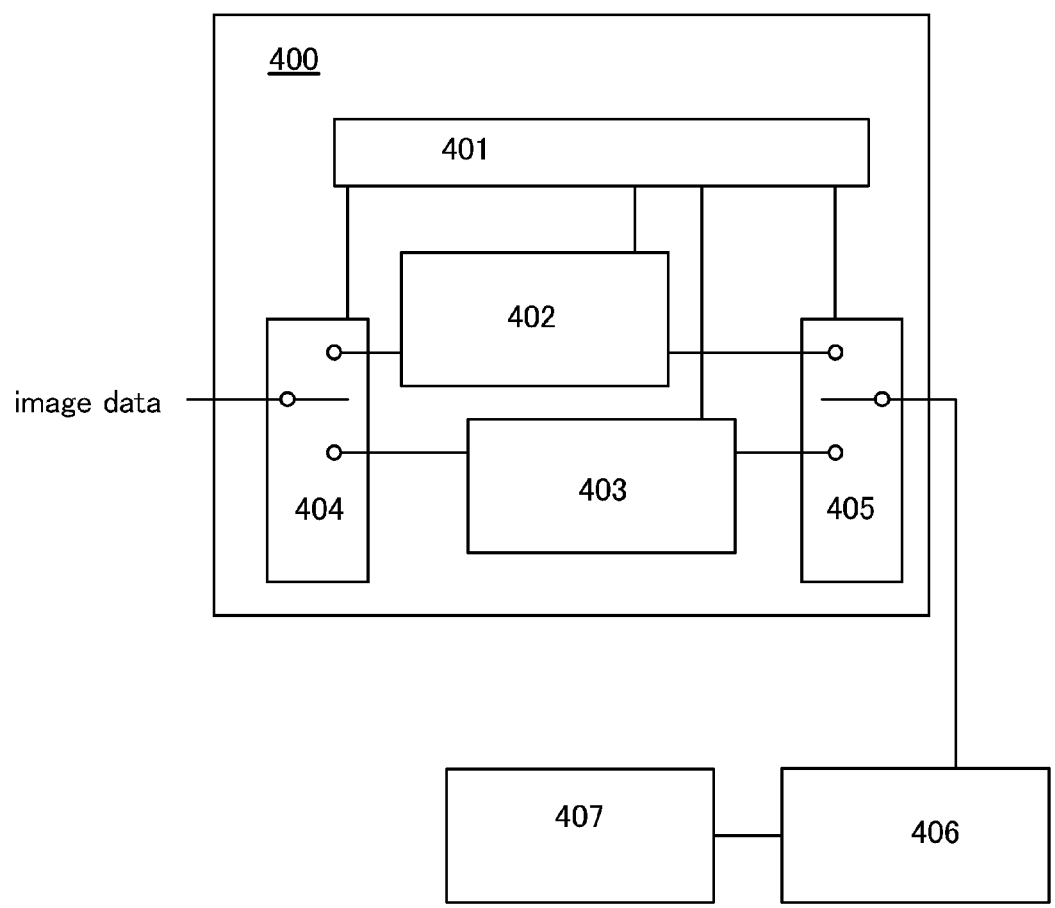
FIG. 14 is a block diagram of an electronic device according to an embodiment of the present invention.

Next, FIG. 14 illustrates an example in which the semiconductor device described in any of the above embodiments is used in a memory circuit 400 for a display. The memory circuit 400 illustrated in FIG. 14 includes a memory 402, a memory 403, a switch 404, a switch 405, and a memory controller 401. The memory 402 and the memory 403 are formed using the semiconductor device described in any of the above embodiments.

First, image data is produced by an application processor (not illustrated). The image data formed (input image data 1) is stored in the memory 402 through the switch 404. Then, the image data stored in the memory 402 (stored image data 1) is transmitted to a display 407 through the switch 405 and a display controller 406, and is displayed on the display 407.

When the input image data remains unchanged, the stored image data 1 is read from the memory 402 through the switch 405 by the display controller 406 normally at a frequency of approximately 30 Hz to 60 Hz.

Next, for example, when a user performs an operation to rewrite a screen (i.e., when the input image data is changed), the application processor produces new image data (input image data 2). The input image data 2 is stored in the memory 403 through the switch 404. Also during that time, the stored image data 1 is regularly read from the memory 402 through the switch 405. After the completion of storing the new image data (the stored image data 2) in the memory 403, from the next frame for the display 407, the stored image data 2 starts to be read, transmitted to the display 407 through the switch 405 and the display controller 406, and displayed on the display 407. This reading operation continues until the next new image data is stored in the memory 402.

By alternately writing and reading data to and from the memory 402 and the memory 403 as described above, images are displayed on the display 407. Note that the memory 402 and the memory 403 are not limited to separate memories, and a single memory may be divided and used. By employing the semiconductor device described in any of the above embodiments for the memory 402 and the memory 403, data can be written and read at high speed and held for a long time, and power consumption can be sufficiently reduced.

Figure 15:
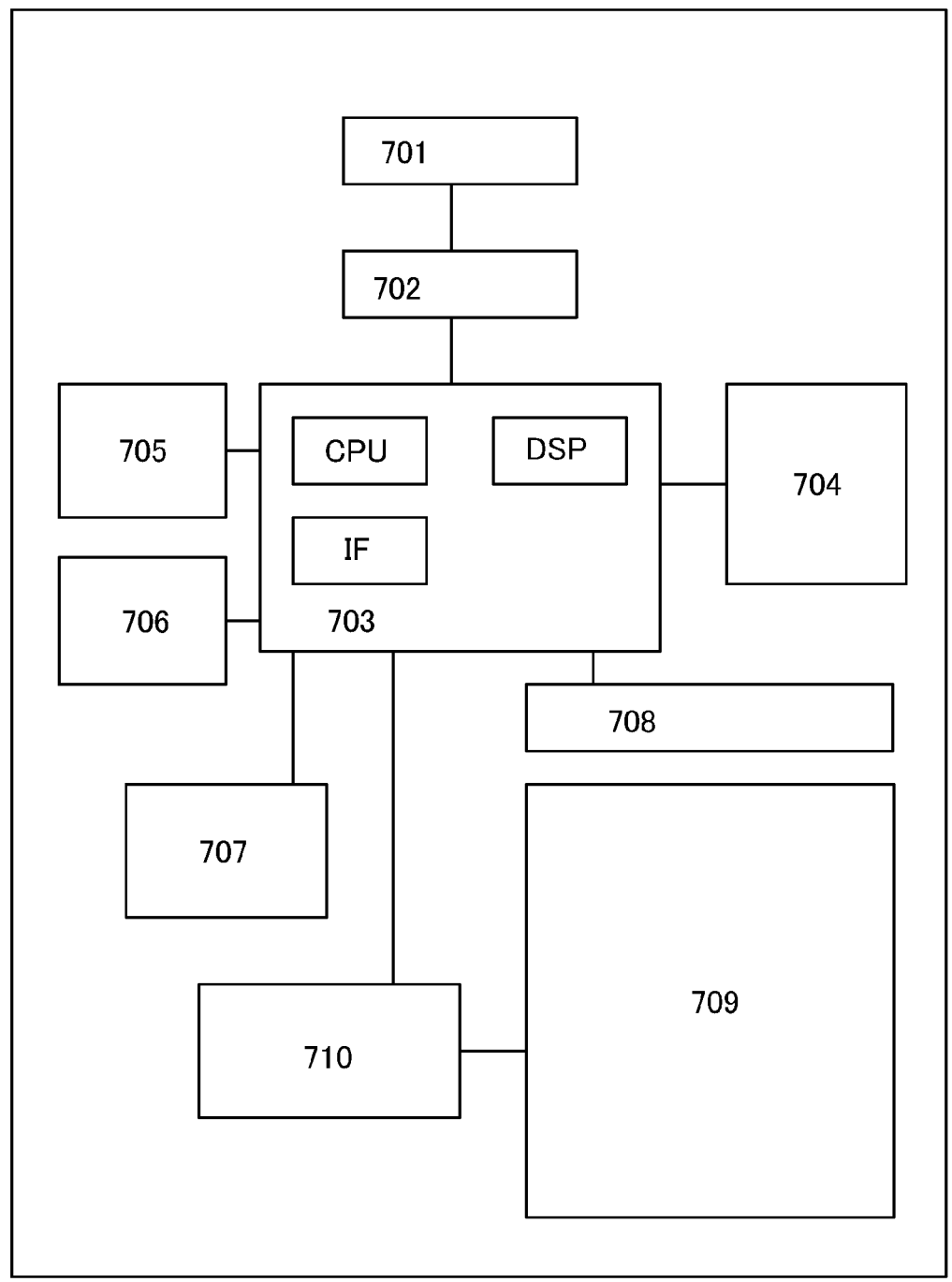
FIG. 15 is a block diagram of an electronic device according to an embodiment of the present invention.

Next, FIG. 15 is a block diagram of an electronic book. FIG. 15 includes a battery 701, a power supply circuit 702, a microprocessor 703, a flash memory 704, an audio circuit 705, a keyboard 706, a memory circuit 707, a touch panel 708, a display 709, and a display controller 710. One embodiment of the present invention can be applied to the memory circuit 707. The memory circuit 707 has a function to temporarily hold the contents of a book. For example, a user may use a highlight function. In some cases, a user wants to mark a specific portion while reading an electronic book. This marking function is called highlight function and is used to make a difference from the other portions by changing the display color, underlining, making characters bold, changing the font of characters, or the like. The function makes it possible to store and hold data of a portion specified by a user. In order to store the data for a long time, the data may be copied to the flash memory 704. Also in such a case, by employing the semiconductor device described in any of the above embodiments, data can be written and read at high speed and held for a long time, and power consumption can be sufficiently reduced.

Embodiment 5

In this embodiment, the cases where the semiconductor device described in any of the above embodiments is applied to electronic devices will be described with reference to FIGS. 16A to 16F. The cases where any of the above-described semiconductor devices is applied to electronic devices such as a computer, a mobile phone set (also referred to as a mobile phone or a mobile phone device), a portable information terminal (including a portable game machine, an audio reproducing device, and the like), a digital camera, a digital video camera, electronic paper, a television set (also referred to as a television or a television receiver), and the like are described in this embodiment.

Figure 16A:
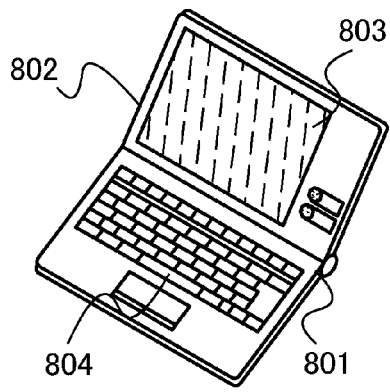
FIGS. 16A to 16F each illustrate an electronic device according to an embodiment of the present invention.

FIG. 16A illustrates a notebook personal computer, which includes a housing 801, a housing 802, a display portion 803, a keyboard 804, and the like. The memory circuit described in Embodiment 4 is provided inside at least one of the housings 801 and 802. Furthermore, the memory circuit includes any of the semiconductor devices described in Embodiment 3. Thus, a notebook personal computer with sufficiently low power consumption, in which writing and reading of data can be performed at high speed and data can be stored for a long time, can be obtained.

Figure 16B:
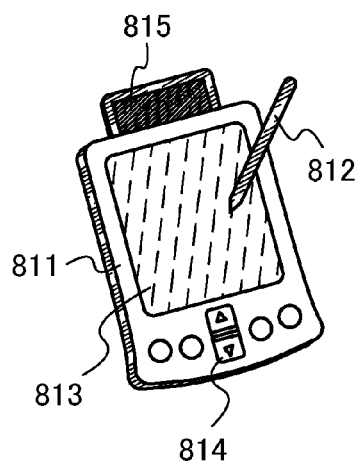

FIG. 16B illustrates a portable information terminal (PDA). A main body 811 is provided with a display portion 813, an external interface 815, operation buttons 814, and the like. Further, a stylus 812 for operation of the portable information terminal, or the like is provided. The memory circuit described in Embodiment 4 is provided inside the main body 811. Furthermore, the memory circuit includes any of the semiconductor devices described in Embodiment 3. Thus, a portable information terminal with sufficiently low power consumption, in which writing and reading of data can be performed at high speed and data can be stored for a long time, can be obtained.

Figure 16C:
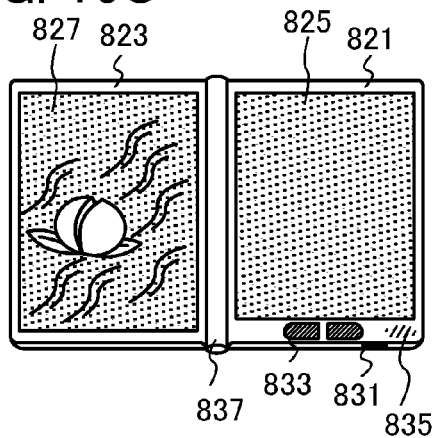

FIG. 16C illustrates an electronic book incorporating electronic paper, which includes two housings, a housing 821 and a housing 823. The housing 821 and the housing 823 include a display portion 825 and a display portion 827, respectively. The housing 821 is connected to the housing 823 by a hinge 837, so that the electronic book can be opened and closed using the hinge 837 as an axis. In addition, the housing 821 is provided with a power switch 831, operation keys 833, a speaker 835, and the like. The memory circuit described in Embodiment 4 is provided inside at least one of the housings 821 and 823. Furthermore, the memory circuit includes any of the semiconductor devices described in Embodiment 3. Thus, an electronic book with sufficiently low power consumption, in which writing and reading of data can be performed at high speed and data can be stored for a long time, can be obtained.

Figure 16D:
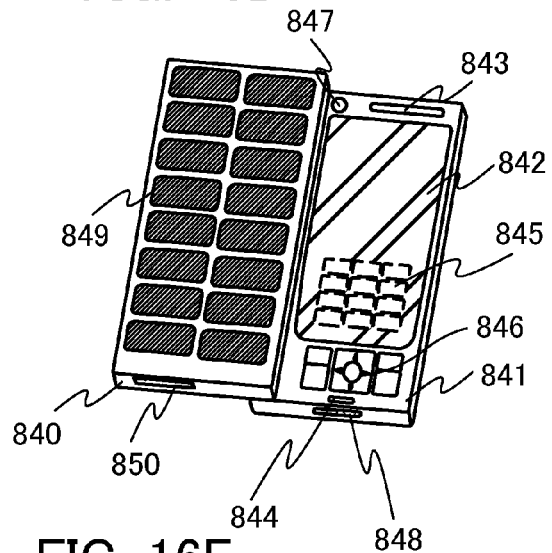

FIG. 16D illustrates a mobile phone set, which includes two housings, a housing 840 and a housing 841. Moreover, the housings 840 and 841 in a state where they are developed as illustrated in FIG. 16D can be slid so that one is lapped over the other. Accordingly, the size of the mobile phone set can be reduced, which makes the mobile phone set suitable for being carried around. The housing 841 includes a display panel 842, a speaker 843, a microphone 844, operation keys 845, a pointing device 846, a camera lens 847, an external connection terminal 848, and the like. The housing 840 includes a solar cell 849 for charging the mobile phone set, an external memory slot 850, and the like. An antenna is incorporated in the housing 841. The memory circuit described in Embodiment 4 is provided inside at least one of the housings 840 and 841. Furthermore, the memory circuit includes any of the semiconductor devices described in Embodiment 3. Thus, a mobile phone set with sufficiently low power consumption, in which writing and reading of data can be performed at high speed and data can be stored for a long time, can be obtained.

Figure 16E:
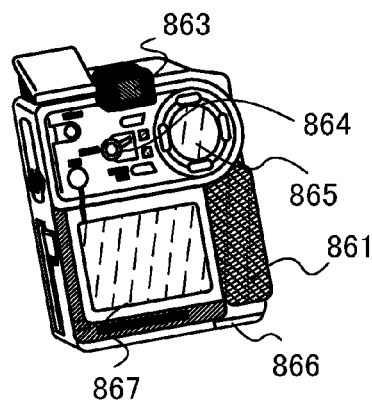

FIG. 16E illustrates a digital camera, which includes a main body 861, a display portion 867, an eyepiece 863, an operation switch 864, a display portion 865, a battery 866, and the like. The memory circuit described in Embodiment 4 is provided inside the main body 861. Furthermore, the memory circuit includes any of the semiconductor devices described in Embodiment 3. Thus, a digital camera with sufficiently low power consumption, in which writing and reading of data can be performed at high speed and data can be stored for a long time, can be obtained.

Figure 16F:
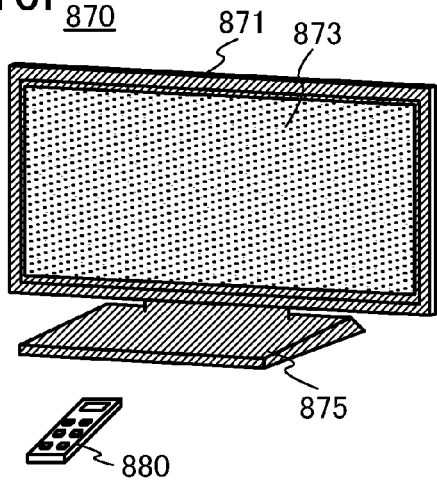

FIG. 16F is a television set 870, which includes a housing 871, a display portion 873, a stand 875, and the like. The television set 870 can be operated with a switch included in the housing 871 or with a remote controller 880. The memory circuit described in Embodiment 4 is provided inside the housing 871 and the remote controller 880. Furthermore, the memory circuit includes any of the semiconductor devices described in Embodiment 3. Thus, a television set with sufficiently low power consumption, in which writing and reading of data can be performed at high speed and data can be stored for a long time, can be obtained.

As described above, the electronic devices described in this embodiment each include any of the semiconductor devices according to the above embodiment. Therefore, electronic devices with low power consumption can be obtained.

This application is based on Japanese Patent Application Ser. No. 2011-048134 filed with Japan Patent Office on Mar. 4, 2011, the entire contents of which are hereby incorporated by reference.

What is claimed is:

1. A method for manufacturing a semiconductor device, comprising the steps of:
sequentially forming a first insulating film, an oxide semiconductor film, and a second insulating film over a substrate;
forming an element isolation groove in the first insulating film by etching an element isolation region of the second insulating film, the oxide semiconductor film, and the first insulating film;
forming a third insulating film over the second insulating film and the element isolation groove;
planarizing the third insulating film to expose the second insulating film and to embed the third insulating film in the element isolation groove;
etching the second insulating film to expose the oxide semiconductor film;
forming a gate insulating film over the third insulating film and the exposed oxide semiconductor film; and
forming a gate electrode over the gate insulating film.

2. The method for manufacturing a semiconductor device according to claim 1, wherein the first insulating film is formed using at least one of silicon oxide, silicon oxynitride, silicon nitride oxide, aluminum oxynitride, gallium oxide, hafnium oxide, and yttrium oxide.

3. The method for manufacturing a semiconductor device according to claim 1, wherein the third insulating film is formed using aluminum oxide.

4. The method for manufacturing a semiconductor device according to claim 1, wherein the oxide semiconductor film is formed using a metal oxide containing at least one element selected from In, Ga, Sn, and Zn.

5. A method for manufacturing a semiconductor device, comprising the steps of:
sequentially forming a first insulating film, an oxide semiconductor film, and a second insulating film over a substrate;
forming an element isolation groove in the first insulating film by etching an element isolation region of the second insulating film, the oxide semiconductor film, and the first insulating film;
forming a third insulating film over the second insulating film and the element isolation groove;
planarizing the third insulating film to expose the second insulating film and to embed the third insulating film in the element isolation groove;
etching the second insulating film to expose the oxide semiconductor film;
heating the first insulating film and the exposed oxide semiconductor film;
forming a gate insulating film over the third insulating film and the exposed oxide semiconductor film; and
forming a gate electrode over the gate insulating film,
wherein impurities including hydrogen in the oxide semiconductor film are removed by the heating step, and
wherein oxygen in the first insulating film is supplied to the oxide semiconductor film by the heating step.

6. The method for manufacturing a semiconductor device according to claim 5, wherein the first insulating film is formed using at least one of silicon oxide, silicon oxynitride, silicon nitride oxide, aluminum oxynitride, gallium oxide, hafnium oxide, and yttrium oxide.

7. The method for manufacturing a semiconductor device according to claim 5, wherein the third insulating film is formed using aluminum oxide.

8. The method for manufacturing a semiconductor device according to claim 5, wherein the oxide semiconductor film is formed using a metal oxide containing at least one element selected from In, Ga, Sn, and Zn.

9. A method for manufacturing a semiconductor device, comprising the steps of:
sequentially forming a first insulating film, an oxide semiconductor film, and a second insulating film over a substrate;

forming an element isolation groove in the first insulating film by etching an element isolation region of the second insulating film, the oxide semiconductor film, and the first insulating film;

forming a third insulating film over the second insulating film and the element isolation groove;

exposing the second insulating film and embedding the third insulating film in the element isolation groove by subjecting the third insulating film to a planarization treatment;

exposing the oxide semiconductor film by etching the second insulating film;

forming a gate insulating film over the third insulating film and the exposed oxide semiconductor film;

forming a gate electrode over the gate insulating film;

forming a first region containing a dopant at a first concentration in the oxide semiconductor film by adding the dopant to the oxide semiconductor film using the gate electrode as a mask;

forming a sidewall insulating film on a side surface of the gate electrode;

forming a second region containing the dopant at a second concentration in the oxide semiconductor film by adding the dopant to the oxide semiconductor film using the gate electrode and the sidewall insulating film as a mask; and forming a source electrode and a drain electrode in contact with the third insulating film and the second region containing the dopant.

10. The method for manufacturing a semiconductor device according to claim 9, wherein the first concentration of the dopant in the first region containing the dopant is lower than the second concentration of the dopant in the second region containing the dopant.

11. The method for manufacturing a semiconductor device according to claim 9, wherein the source electrode or the drain electrode comprises a first conductive film and a second conductive film, and wherein the first conductive film is in contact with the sidewall insulating film.

12. The method for manufacturing a semiconductor device according to claim 11, wherein the first conductive film is thinner than the second conductive film.

13. The method for manufacturing a semiconductor device according to claim 9, wherein the first insulating film is formed using at least one of silicon oxide, silicon oxynitride, silicon nitride oxide, aluminum oxynitride, gallium oxide, hafnium oxide, and yttrium oxide.

14. The method for manufacturing a semiconductor device according to claim 9, wherein the third insulating film is formed using aluminum oxide.

15. The method for manufacturing a semiconductor device according to claim 9, wherein the oxide semiconductor film is formed using a metal oxide containing at least one element selected from In, Ga, Sn, and Zn.

* * * * *